(12) United States Patent
Sogawa et al.

(10) Patent No.: US 7,023,284 B2
(45) Date of Patent: Apr. 4, 2006

(54) DUAL LOOP PHASE LOCKED LOOP

(75) Inventors: Kazuaki Sogawa, Katano (JP); Ryoichi Suzuki, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 17 days.

(21) Appl. No.: 10/485,861

(22) PCT Filed: Apr. 17, 2003

(86) PCT No.: PCT/JP03/04927

§ 371 (c)(1),
(2), (4) Date: Feb. 5, 2004

(87) PCT Pub. No.: WO03/090358

PCT Pub. Date: Oct. 30, 2003

(65) Prior Publication Data

US 2004/0196107 A1    Oct. 7, 2004

(30) Foreign Application Priority Data

Apr. 19, 2002 (JP) .............................. 2002-117154

(51) Int. Cl.
*H03L 7/00* (2006.01)

(52) U.S. Cl. ......................................... 331/10; 327/141

(58) Field of Classification Search .................. 331/10, 331/11, 14, 17, 18, 25; 327/141, 156, 162; 375/375, 376, 373

See application file for complete search history.

(56) References Cited

U.S. PATENT DOCUMENTS 5,506,875 A * 4/1996 Nuckolls et al. ............ 375/375
6,504,438 B1 * 1/2003 Chang et al. ................. 331/17
6,650,720 B1 * 11/2003 Grung et al. ................ 375/375

FOREIGN PATENT DOCUMENTS

JP       09-246963       9/1997
JP       2001-332969    11/2001

OTHER PUBLICATIONS

Yi-Cheng Chang et al., " Monolithic Phase-Locked Loop Circuits with Coarse-Steering Acquisition Aid", Department of Electrical Engineering Arizona State University, Tempe, AZ 85287, 1999 IEEE, pp. 283-286.

* cited by examiner

*Primary Examiner*—Linh My Nguyen
(74) *Attorney, Agent, or Firm*—McDermott Will & Emery LLP

(57) ABSTRACT

In a dual loop PLL having a frequency comparison loop and a phase comparison loop, when an input control circuit 30 of an up/down counter 8 receives an UP signal from a frequency comparator 7, the input control circuit 30 outputs a positive value of a ½ of a previous addition/subtraction result value. When the input control circuit 30 receives a DOWN signal from the frequency comparator 7, the input control circuit 30 outputs a negative value of a ½ of the previous addition/subtraction result value. A register 33 stores a count value. The adder 31 adds the output of the input control circuit 30 to the output of the register 33. Thus, the up/down counter 8 increments or decrements by a ½ value of the previous addition/subtraction result value, and the dual loop PLL performs a frequency comparison based on a dichotomizing search method. Therefore, even when the output frequency is high, the frequency comparison is efficiently performed, and the lock up time is reduced.

9 Claims, 13 Drawing Sheets

DUAL LOOP PHASE LOCKED LOOP

TECHNICAL FIELD

The present invention relates to a dual loop PLL which includes a frequency comparison loop and a phase comparison loop.

BACKGROUND ART

Among conventional PLLs (Phase Locked Loops), there has been a dual loop PLL which includes a frequency comparison loop and a phase comparison loop and which achieves phase synchronization over a wide output frequency range without increasing the gain of a voltage controlled oscillator. This conventional technique is disclosed in, for example, Yi-Cheng Chang, Edwin W. Greeneich, "MONOLITHIC PHASE-LOCKED LOOP CIRCUITS WITH COARSE-STEERING ACQUISITION AID" Circuits and Systems, 1999. 42nd Midwest Symposium on Volume: 1, 1999 Page(s): 283–286 vol. 1.

The dual loop PLL is capable of decreasing the gain of a voltage controlled oscillator even if the output frequency range is expanded. Thus, the dual loop PLL has the advantage of decreasing the influence which is caused by a variation of a voltage input to the voltage controlled oscillator and imposed on the oscillation frequency. Further, the dual loop PLL has the function of autonomously correcting the characteristics of the voltage controlled oscillator to necessary characteristics by a frequency comparison even when the characteristics of the voltage controlled oscillator are varied due to variations in the production process.

FIG. 13 shows a circuit structure of a conventional dual loop PLL. In FIG. 13, reference numeral 1 denotes a phase comparator, reference numeral 2 denotes a charge pump, reference numeral 3 denotes an operation mode switch which switches between the P-side and the F-side, reference numeral 4 denotes a loop filter, reference numeral 5 denotes a voltage controlled oscillator (VCO), reference numeral 6 denotes a frequency divider circuit, reference numeral 7 denotes a frequency comparator, reference numeral 8 denotes an up/down counter, reference numeral 9 denotes a VCO characteristic control circuit, reference numeral 10 denotes external reference clock CLex, reference numeral 11 denotes internal clock CLin, reference numeral 15 denotes reference voltage Vref, reference numeral 16 denotes frequency comparison stop signal FSTOP, and reference mark OUT denotes an output terminal to which the output side of the voltage controlled oscillator 5 is connected.

Hereinafter, an operation of the dual loop PLL is described with reference to FIG. 13.

First, in the dual loop PLL, the operation mode switch 3 is set on the F-side, so that a voltage input to the loop filter 4 is reference voltage Vref (15), and the loop starting from the phase comparator 1 is open. Thus, the loop is a frequency comparison loop which passes through the frequency comparator 7, the up/down counter 8, the VCO characteristic control circuit 9, the voltage controlled oscillator 5 and the frequency divider circuit 6.

In the frequency comparison loop, constant reference voltage Vref (15) is supplied as an input voltage to the voltage controlled oscillator 5. The dual loop PLL operates only in a frequency comparison mode. In the frequency comparison mode, the frequency comparator 7 compares the frequency of internal clock CLin (11), which is obtained by dividing the output frequency of the voltage controlled oscillator 5, with the frequency of external reference clock CLex (10). If the frequency of external reference clock CLex (10) is higher than the frequency of internal clock CLin (11), the frequency comparator 7 outputs an UP signal. If the frequency of external reference clock CLex (10) is lower than the frequency of internal clock CLin (11), the frequency comparator 7 outputs an DOWN signal. Receiving the UP signal or DOWN signal from the frequency comparator 7, the up/down counter 8 adds or subtracts "1" to/from the count value according to the received signal. Receiving a digital output of the up/down counter 8, the VCO characteristic control circuit 9 shifts the V-F (input voltage to frequency) characteristic of the voltage controlled oscillator 5 according to the value of the received digital output to change the output frequency. As a result, the frequency of internal clock CLin (11) increasingly or decreasingly changes to a frequency closer to that of external reference clock CLex (10).

The series of operations described above, i.e., a frequency comparison of external reference clock CLex (10) and internal clock CLin (11), change of the count value of the up/down counter 8 according to a result of the frequency comparison, and change of the V-F characteristic of the voltage controlled oscillator 5 by the VCO characteristic control circuit 9 such that the frequency of internal clock CLin (11) is changed to a frequency closer to that of external reference clock CLex (10), is repeated until these frequencies becomes substantially equal, and the frequency comparator 7 outputs frequency comparison stop signal FSTOP (16).

After the frequency comparator 7 outputs frequency comparison stop signal FSTOP (16), the count value of the up/down counter 8 is fixed, and the operation mode switch 3 switches from the F-side to the P-side, so that the output side of the charge pump 2 is connected to the input side of the loop filter 4. As a result, the loop changes to a phase comparison loop which passes through the phase comparator 1, the charge pump 2, the loop filter 4, the voltage controlled oscillator 5 and the frequency divider circuit 6.

In the phase comparison loop, the phase comparator 1 compares the phase of external reference clock CLex (10) with the phase of internal clock CLin (11). If the phase of external reference clock CLex (10) is faster than the phase of internal clock CLin (11), the phase comparator 1 outputs an UP signal for a time period corresponding to the phase difference. If the phase of external reference clock CLex (10) is slower than the phase of internal clock CLin (11), the phase comparator 1 outputs a DOWN signal for a time period corresponding to the phase difference. The charge pump 2 charges or discharges the loop filter 4 according to the UP signal or DOWN signal from the phase comparator 1. The loop filter 4 integrates the charging or discharging operation performed by the charge pump 2 and converts the integral to a direct voltage, which is employed as an input voltage to the voltage controlled oscillator 5. According to the input voltage, the output frequency of the voltage controlled oscillator 5 is changed. The series of operations described above is repeated until the phase of external reference clock CLex (10) and phase of internal clock CLin (11) are synchronized with each other, so that the output of the voltage controlled oscillator 5 is a signal (clock) which is synchronized with external reference clock CLex (10) and which has a frequency higher than that of external reference clock CLex (10) by a factor of N (N is the frequency dividing ratio of the frequency divider circuit 6).

Problems to be Solved

In the structure of the conventional dual loop PLL described above, the up/down counter 8 in the frequency comparison loop changes on a "1"-step by "1"-step basis. For example, when the maximum oscillation frequency is demanded in the voltage controlled oscillator 5, the count value of the up/down counter 8 must be changed to a maximum value. To this end, a frequency comparison in the frequency comparator 7 must be repeated $2^M$ times (M is the number of bits of the up/down counter 8). Accordingly, the lock up time of the dual loop PLL increases.

DISCLOSURE OF INVENTION

The present invention was conceived for the purpose of overcoming the above problems involved in the conventional techniques. An objective of the present invention is to provide a dual loop PLL capable of efficiently performing a frequency comparison at a high speed.

For the purpose of achieving the above objective, in a dual loop PLL of the present invention, a frequency comparison is efficiently performed based on a dichotomizing search method.

A dual loop PLL of the present invention comprises: a frequency comparison loop which includes a frequency comparator and a phase comparison loop which includes a phase comparator, wherein in the frequency comparison loop, a frequency comparison between a reference frequency and an output frequency is performed based on a dichotomizing search method.

According to the present invention, in the dual loop PLL, the frequency comparison loop includes the frequency comparator, an up/down counter for incrementing or decrementing a count value according to a comparison result from the frequency comparator, and a voltage controlled oscillator for changing the output frequency according to the count value of the up/down counter; and the up/down counter includes a register for storing the count value, an input control circuit for outputting a positive or negative value of a ½ of a previous addition/subtraction result value according to the comparison result from the frequency comparator, and an adder for adding the count value of the register to the output of the input control circuit.

According to the present invention, in the dual loop PLL, the frequency comparator includes an accuracy varying circuit for varying a frequency comparison accuracy for respective steps of the frequency comparison along with the progress of the dichotomizing search.

According to the present invention, in the dual loop PLL, the frequency comparator is structured such that if the output frequency is equal to or lower than the reference frequency, the frequency comparator outputs an UP signal, and if the output frequency is equal to or higher than the reference frequency, the frequency comparator outputs an DOWN signal; and the up/down counter includes an error count prevention circuit for prohibiting an increment or decrement of the count value when the UP signal and DOWN signal are simultaneously received from the frequency comparator.

According to the present invention, in the dual loop PLL, the frequency comparator avoids comparing a transient frequency, which occurs during the period when the voltage controlled oscillator controls a variation in the output frequency, with the reference frequency.

According to the present invention, in the dual loop PLL, the phase comparison loop includes a voltage controlled oscillator, and a loop filter placed at a stage previous to the voltage controlled oscillator; and when the frequency comparison loop is formed, the loop filter is disconnected from the voltage controlled oscillator, and a reference voltage having a predetermined value is supplied to the loop filter and the voltage controlled oscillator.

According to the present invention, in the dual loop PLL, when the frequency comparison loop is formed, the voltage controlled oscillator receives a reference voltage having a predetermined value; and the up/down counter includes a priority switch circuit which receives a comparison result from the frequency comparator and, if the reference frequency and the output frequency are equal to each other, priorly increments or decrements a count value according to a variation of the reference voltage from the predetermined value.

According to the present invention, the dual loop PLL further comprising: a charge pump placed at a stage subsequent to the phase comparator; a loop filter which is charged and discharged by the charge pump; and a voltage controlled oscillator to which an input voltage is supplied from the loop filter, wherein in the frequency comparison mode, the charge pump supplies a reference voltage having a predetermined value to the loop filter, and in the phase comparison mode, the charge pump charges or discharges the loop filter according to an output of the phase comparator.

According to the present invention, in the dual loop PLL, the phase comparison loop includes a charge pump placed at a stage subsequent to the phase comparator, a loop filter placed at a stage subsequent to the charge pump; and the loop filter includes a resistor having an end connected to the output side of the charge pump, and a N-type transistor and a P-type transistor whose gate terminals are connected to the other end of the resistor, wherein the N-type transistor has a source terminal, a drain terminal and a bulk terminal which are connected to the ground, and the P-type transistor has a source terminal, a drain terminal and a bulk terminal which are connected to the power supply.

Thus, according to the present invention, in a dual loop PLL, the frequency comparison in a frequency comparison loop is performed based on a dichotomizing search method. Thus, the frequency comparison is efficiently performed, and the lock up time is effectively reduce, as compared with a conventional example where an up/down counter changes on a "1"-step by "1"-step manner. For example, in the case where it is necessary to increase the output frequency up to the maximum frequency, time reduction is possible.

According to the present invention, when a frequency comparison is performed based on a dichotomizing search, the absolute value of a variation in the frequency of the voltage controlled oscillator is moderately decreased on a half-step by half-step basis in the frequency comparison loop. Thus, the comparison accuracy required of the frequency comparator can be decreased more at earlier steps of the frequency comparison. Moreover, the comparison accuracy is varied by an accuracy varying circuit of the frequency comparator. Thus, the comparison accuracy is lower in the earlier steps of the frequency comparison performed along with the progress of the dichotomizing search, and the comparison accuracy of the frequency comparator is optimized for the respective steps of the frequency comparison. As a result, the frequency comparison time in each step is reduced, and moreover, the lock up time is reduced.

According to the present invention, when the output frequency becomes equal to the reference frequency before the frequency comparison based on the dichotomizing method is not completed, the frequency comparator outputs the UP signal and DOWN signal simultaneously. However, an error count prevention circuit prohibits an up count (increment) or down count (decrement) in the up/down counter. Thus, the error count is prevented, and at this point in time, the frequency comparison mode can be ended.

According to the present invention, the frequency comparator avoids comparing a transient output frequency with the reference frequency during the period when the voltage controlled oscillator controls a variation in the output frequency. Thus, the frequency comparison is always performed with the stable output frequency and the reference frequency, and a desirable frequency comparison is secured.

According to the present invention, when the frequency comparison loop is formed, the loop filter is disconnected from the voltage controlled oscillator so that a predetermined reference voltage of a reference voltage circuit is directly supplied to the voltage controlled oscillator. Thus, the loop filter does not constitute a load, and the load on the reference voltage circuit is reduced. Therefore, it is possible to quickly adjust the voltage input to the voltage controlled oscillator to the predetermined reference voltage. Moreover, when the frequency comparison loop is formed, the voltage of the disconnected loop filter is charged to the predetermined reference voltage. Thus, even when the dual loop PLL transitions from the frequency comparison loop to the phase comparison loop so that the loop filter is connected to the voltage controlled oscillator, no variation occurs in the voltage input to the voltage controlled oscillator, and thus, the lock up time of the PLL is reduced.

According to the present invention, when the frequency comparison loop is formed, if the reference voltage input to the voltage controlled oscillator is lower or higher than the predetermined value, the voltage which is input to the voltage controlled oscillator during the PLL being locked is lower or higher than the reference voltage having the predetermined value. However, when a comparison result from the frequency comparator indicates that the reference frequency and the output frequency are substantially equal to each other, a priority switch circuit of the up/down counter priorly decrements or increments the count value according to the variation direction of the reference voltage. Thus, the voltage which is input to the voltage controlled oscillator during the PLL being locked results in a reference voltage substantially equal to the predetermined value. Therefore, even when the voltage value of the reference voltage supplied to the voltage controlled oscillator is varied due to variations in the production process, the voltage which is input to the voltage controlled oscillator during the PLL being locked is adjusted to an optimum reference voltage having the predetermined value.

According to the present invention, the function of an operation mode switch, which switches the operation mode between the frequency comparison mode and the phase comparison mode, is realized by a charge pump. Thus, it is not necessary to provide the operation mode switch. Moreover, the reference voltage required by the loop filter when the frequency comparison mode is selected is generated by the charge pump. Thus, it is not necessary to provide a reference voltage generation circuit.

According to the present invention, in the loop filter, a leaked current flowing from a N-type transistor, which may occur in the power down mode, is cancelled by a leaked current flowing from a P-type transistor, which is connected to the power supply, to the N-type transistor. Thus, the potential of the loop filter is maintained at a substantially constant potential for a long time period. Therefore, after the PLL transitions from the power down mode to the normal operation, locking of the PLL can be achieved within a short time period as compared with conventional loop filters.

Furthermore, since the P-type transistor connected to the power supply is provided in addition to the N-type transistor connected to the ground, a variation in a combined MOS capacitance with respect to a bias voltage is restricted to a small variation.

BEST MODE FOR CARRYING OUT THE INVENTION

Hereinafter, embodiments of the present invention are described with reference to the drawings.

(Embodiment 1)

Figure 1:
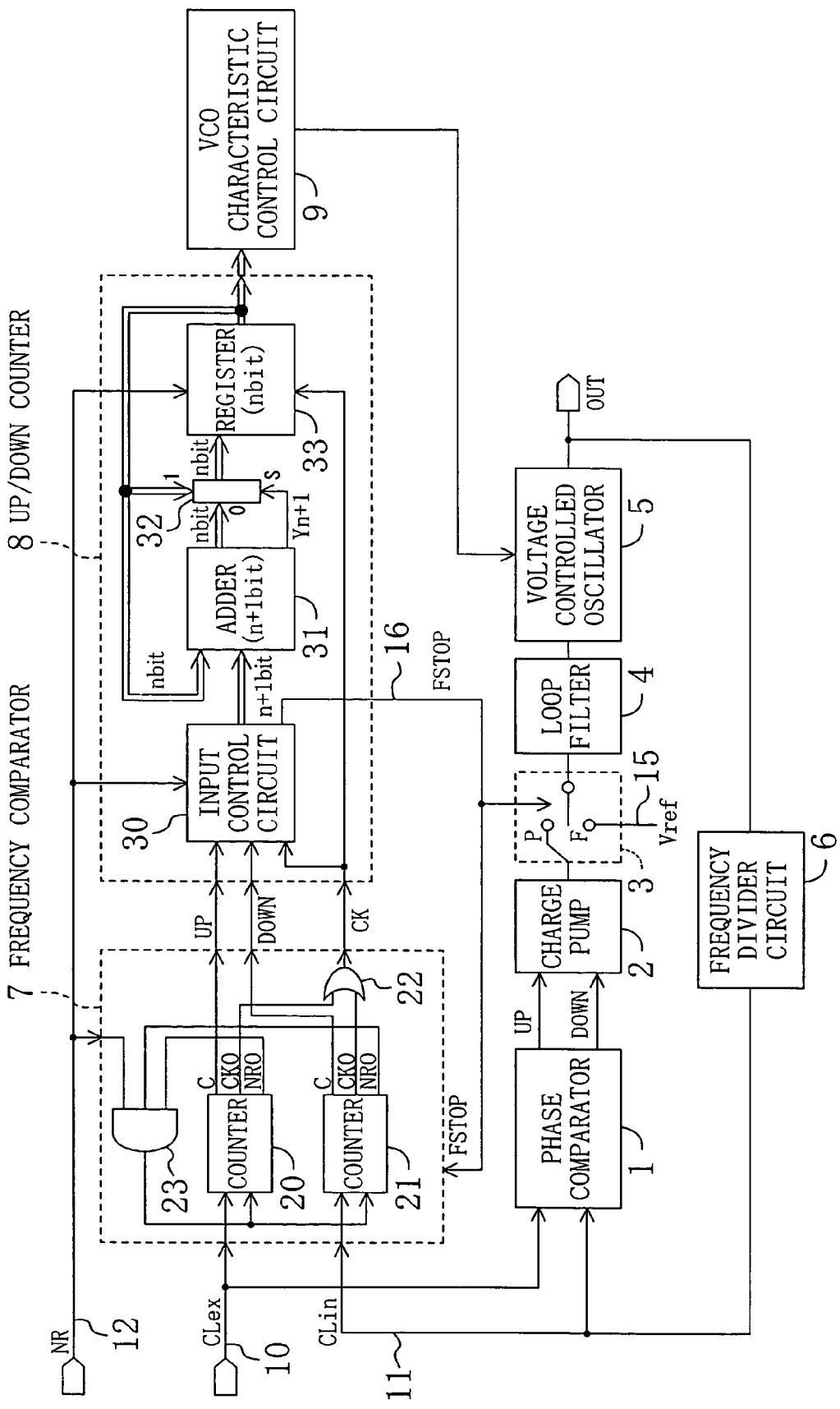
FIG. 1 shows a circuit structure of a dual loop PLL according to embodiment 1 of the present invention.

FIG. 1 shows a circuit structure of a dual loop PLL according to embodiment 1 of the present invention. In FIG. 1, reference numeral 1 denotes a phase comparator, reference numeral 2 denotes a charge pump, reference numeral 3 denotes an operation mode switch which switches between the P-side and the F-side, reference numeral 4 denotes a loop filter, reference numeral 5 denotes a voltage controlled oscillator (VCO), reference numeral 6 denotes a frequency divider circuit, reference numeral 7 denotes a frequency comparator, reference numeral 8 denotes an up/down counter, reference numeral 9 denotes a VCO characteristic control circuit, reference numeral 10 denotes external reference clock CLex, reference numeral 11 denotes internal clock CLin, reference numeral 12 denotes reset signal NR, reference numeral 15 denotes reference voltage Vref, and reference numeral 16 denotes frequency coincidence signal FSTOP.

In the frequency comparator 7, reference numerals 20 and 21 denote clock counters, reference numeral 22 denotes a OR circuit, and reference numeral 23 denotes an AND circuit. In the up/down counter 8, reference numeral 30 denotes an input control circuit, reference numeral 31 denotes an adder, reference numeral 32 denotes a selector, and reference numeral 33 denotes a register.

The phase comparator 1 compares external reference clock CLex (10) and internal clock CLin (11). A result of the comparison, i.e., an UP signal or DOWN signal, is input to the charge pump 2. The operation mode switch 3 has a P-side which is connected to the output side of the charge pump 2 and a F-side which is connected to reference voltage Vref (15). The operation mode switch 3 switches between the P-side and the F-side under the control of frequency coincidence signal FSTOP (16) output from the up/down counter 8. The loop filter 4 is connected to the output side of the operation mode switch 3. The output of the loop filter 4 is input to the voltage controlled oscillator 5, and the frequency of the voltage controlled oscillator 5 is changed according to the voltage input from the loop filter 4. The output frequency of the voltage controlled oscillator 5 is divided by the frequency divider circuit 6 to generate internal clock CLin (11).

Receiving external reference clock CLex (10) and internal clock CLin (11), the frequency comparator 7 compares the frequencies of these clocks (reference frequency and output frequency) to output a UP signal or DOWN signal as a result signal of the comparison. On the other hand, the frequency comparator 7 is initialized by reset signal NR (12). Receiving frequency coincidence signal FSTOP (16) from the up/down counter 8, the frequency comparator 7 stops a frequency comparison. Receiving the UP signal or DOWN signal from the frequency comparator 7, the up/down counter 8 updates the count value. The up/down counter 8 is initialized by reset signal NR (12). The VCO characteristic control circuit 9 receives the count value of the up/down counter 8 and controls the V-F characteristic of the voltage controlled oscillator 5 based on the count value.

Next, the structure of the frequency comparator 7 is described in detail. In the frequency comparator 7, the clock counter 20 counts external reference clock CLex (10). The clock counter 20 is reset by the output of an AND circuit 23 (described later). Output signal C of the clock counter 20 is an UP signal. The other clock counter 21 counts internal clock CLin (11). The clock counter 21 is reset by the output of the AND circuit 23. Output signal C of the clock counter 21 is a DOWN signal. The OR circuit 22 receives outputs CKO (described later) from the two clock counters 20 and 21. The output of the OR circuit 22 is clock signal CK output from the frequency comparator 7. The AND circuit 23 receives reset signal NR (12) and outputs NRO (described later) from the clock counters 20 and 21. The output signal of the AND circuit 23 is a reset signal which resets the clock counters 20 and 21.

Figure 2:
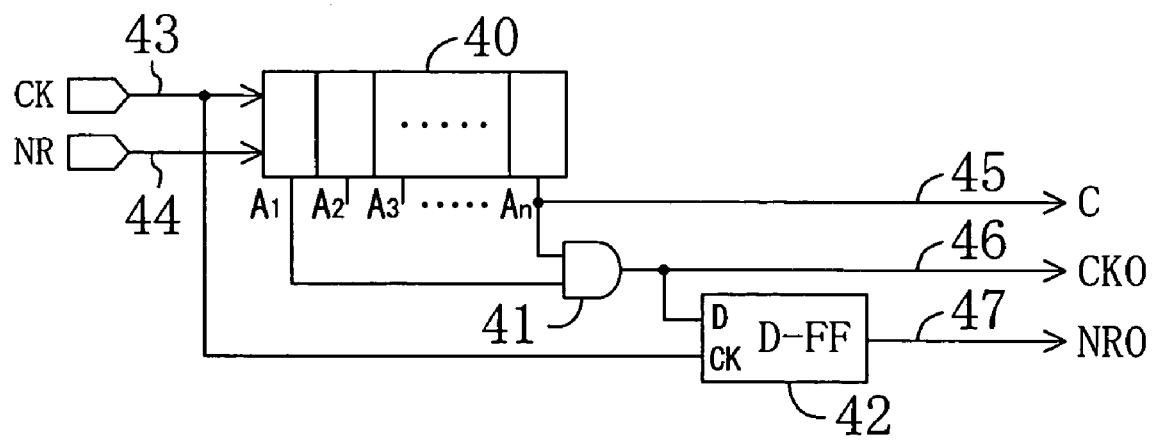
FIG. 2 shows a circuit structure of a clock counter included in a frequency comparator of the dual loop PLL according to embodiment 1 of the present invention.

The two clock counters 20 and 21 included in the frequency comparator 7 have the same structure. The internal structure of the clock counter 20 is shown in FIG. 2. In FIG. 2, the clock counter 20 includes a counter 40, an AND circuit 41, and a D-type flip flop circuit 42. The counter 40 receives external reference clock CLex (10) at a ck terminal 43 and a reset signal from the AND circuit 23 at a NR terminal. The counter 40 counts the received signal in n bits ($A_1$ to $A_n$).

The most significant bit $A_n$ of the counter 40 is output as a C-signal 45. The AND circuit 41 receives the most significant bit $A_n$ and the least significant bit $A_1$ of the counter 40. The output of the AND circuit 41 is output CKO (46) of the clock counter 20. The D-type flip flop circuit 42 receives output CKO (46) from the AND circuit 41 as a data input. The D-type flip flop circuit 42 receives external reference clock CLex (10) or internal clock CLin (11), which is input at the CK terminal 43, as a clock input. The output of the D-type flip flop circuit 42 is output NRO (4) of the clock counter 20.

Next, the internal structure of the up/down counter 8 shown in FIG. 1 is described. In the up/down counter 8 of FIG. 1, the register 33 stores a previous count value of the up/down counter 8. The input control circuit 30 receives the UP signal from the clock counter 20 of the frequency comparator 7, the DOWN signal from the other clock counter 21 of the frequency comparator 7, and clock signal CK from the OR circuit 22. The input control circuit 30 has an internal structure shown in FIG. 3. The input control circuit 30 outputs a positive or negative value of a ½ value of a previous addition/subtraction result value according to the UP signal or DOWN signal received from the frequency comparator 7 as described later. The adder 31 adds the output of the input control circuit 30 to the output of the register 33. The selector 32 receives the output of the adder 31 and the output of the register 33 and selects one of the received outputs according to the most significant bit of the output of the adder 31 which functions as a control signal. The register 33 receives the output of the selector 32 and latches the received output of the selector 32 based on clock signal CK received from the OR circuit 22 of the frequency comparator 7.

Assuming that the count value of the up/down counter 8 has N bits, the output of the input control circuit 30 and the input and output of the adder 31 each have N+1 bits, and the input and output of the selector 32 and the register 33 each have N bits. The (N+1)th bit (most significant bit) of the output of the adder 31 is used as a sign bit. In this case, the output of the register 33 lacks one bit when it is input to the adder 31. This one bit is compensated for by adding "0" as the most significant bit so that a positive value is always input from the register 33 to the adder 31. The sign bit (the most significant bit of the output of the adder 31) is "1" when the output of the adder 31 is OVERFLOW or a negative value.

The selector 32 receives the sign bit as a control signal. When the sign bit is "1", the selector 32 selects the register 33 so that the output of the register 33 is latched as it is in the register 33, whereby the count value of the up/down counter 8 is prevented from resulting in a wrong value.

Figure 3:
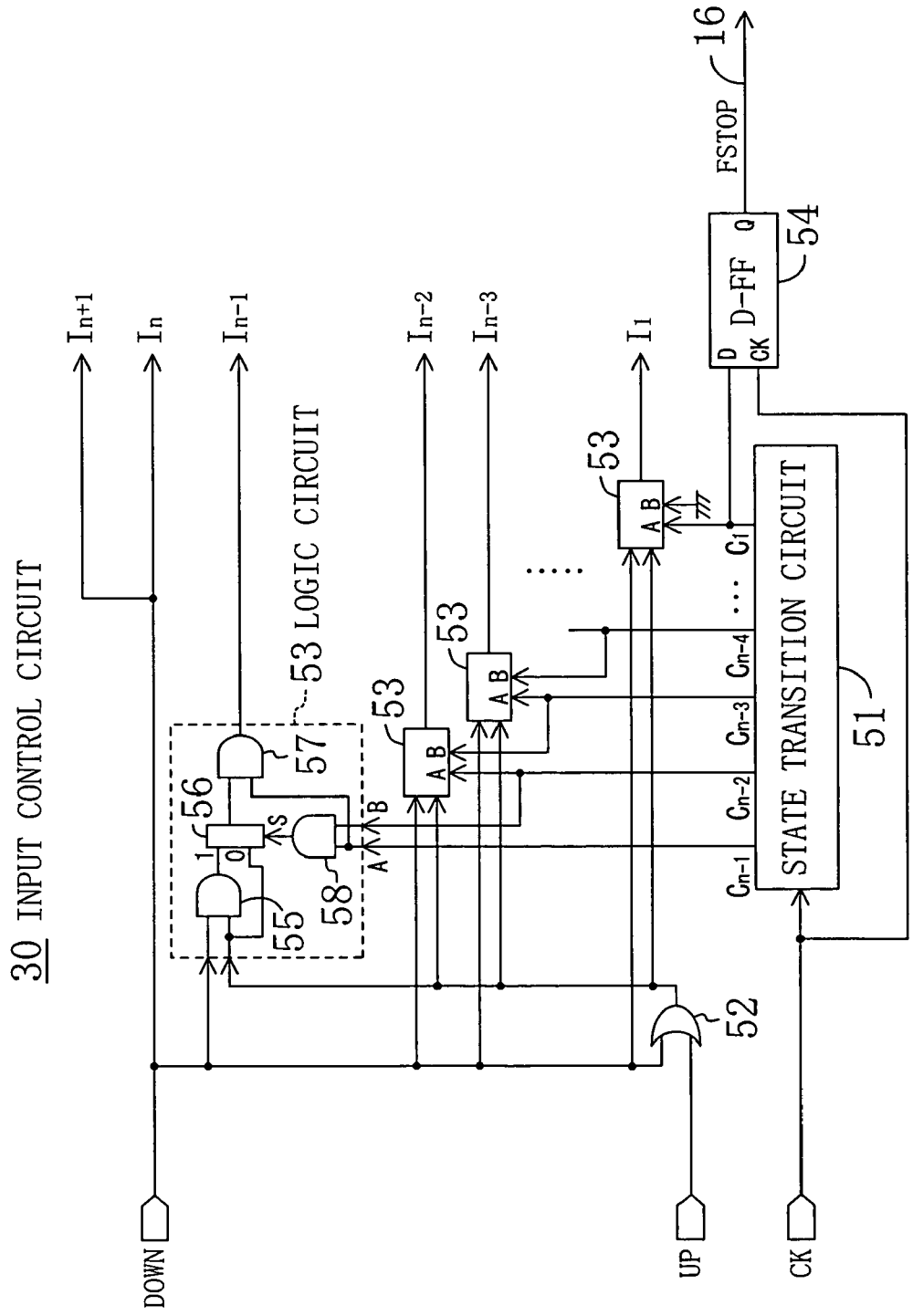
FIG. 3 shows a circuit structure of an input control circuit included in an up/down counter of the dual loop PLL according to embodiment 1 of the present invention.

Referring to FIG. 3, the input control circuit 30 of the up/down counter 8 includes a state transition circuit 51 having N−1 bit ($C_1$ to $C_{n-1}$) outputs, a OR circuit 52, N−1 logic circuits 53, and a D-type flip flop circuit 54. At a time when the state transition circuit 51 is reset, the most significant bit $C_{n-1}$ is "1" and each of the other bits is "0". Thereafter, every time the state transition circuit 51 receives clock signal CK from the frequency comparator 7, the most significant bit among the bits outputting "0" transitions to "1".

The OR circuit 52 receives the DOWN signal and the UP signal from the frequency comparator 7. The logic circuits 53 have the same structure. Referring to FIG. 3, each logic circuit 53 includes an AND circuit 55, a selector 56, and two other AND circuits 57 and 58. The AND circuit 55 receives the output of the OR circuit 52 and the DOWN signal. The selector 56 receives the output of the AND circuit 55 and the output of the OR circuit 52 and operates according to the output of the AND circuit 58 which is used as a control signal. When the control signal is "1", the selector 56 selects the output of the AND circuit 55. When the control signal is "0", the selector 56 selects the output of the OR circuit 52. The AND circuit 57 receives the output of the selector 56 and the output of a corresponding bit of the state transition circuit 51. The output of the AND circuit 57 is the output of the logic circuit 53. The AND circuit 58 receives the output of a corresponding bit of the state transition circuit 51 as an A-terminal input and the output of a bit immediately previous to the corresponding bit as a B-terminal input. The output of the AND circuit 58 functions as a control signal of the selector 56. In the logic circuit 53 to which the least significant bit $C_1$ is input at the A-terminal, "0" (ground potential) is input at the B-terminal.

The D-type flip flop circuit 54 of the input control circuit 30 receives the least significant bit $C_1$ of the state transition circuit 51 as a data input and clock signal CK from the frequency comparator 7 as a clock input.

In the input control circuit 30, the most significant bit $I_{n+1}$ is used as a sign bit. At the most significant bit $I_{n+1}$ and bit $I_n$, the DOWN signal is output as it is. Outputs $I_{n-1}, I_{n-2}, \ldots,$ and $I_1$ of the (N−1)th and subsequent bits are the outputs of the corresponding logic circuits 53.

Next, an operation of the dual loop PLL of the present embodiment is described. The entire operation of the dual loop PLL of the present embodiment is substantially the same as that of the conventional technique. Thus, only an operation performed in the frequency comparison mode with the frequency comparison loop, which is a characteristic feature of the present invention, is described.

In the frequency comparator 7, one of external reference clock CLex (10) and internal clock CLin (11) which has the higher frequency changes the most significant bit of the counter 40 of the clock counter of FIG. 2 to "1" prior to the other one. Thus, in the case where the frequency of external reference clock CLex (10) is higher than that of internal clock CLin (11), the UP signal is output prior to the DOWN signal. In the case where the frequency of internal clock CLin (11) is higher than that of external reference clock CLex (10), the DOWN signal is output prior to the UP signal. As shown in FIG. 2, signal CKO (46) output from each of the clock counters 20 and 21 is AND logic of the most significant bit and the least significant bit of the counter 40. Thus, signal CKO (46) is output at the time delayed by one period of a signal input at the CK terminal 43 from the time when C-signal (UP signal or DOWN signal) is output. Clock signal CK output from the frequency comparator 7 is OR logic of output signals CKO (46) of the clock counters 20 and 21. Thus, if the UP signal is output prior to the DOWN signal, clock signal CK is output after one period of external reference clock CLex (10) has passed. If the DOWN signal is output prior to the UP signal, clock signal CK is output after one period of internal clock CLin (11) has passed.

Since signal NRO (47) of each of the clock counters 20 and 21 is the output of the D-type flip flop circuit 42 as shown in FIG. 2, signal NRO (47) is output at the time delayed by one period of the clock signal input to the CK terminal 43 from the time when signal CKO (46) is output. Each of the signals NRO (47) is input to the AND circuit 23 and resets the clock counter 20 or 21 itself.

In summary, the frequency comparator 7 outputs the UP signal or DOWN signal and outputs clock signal CK one period after the UP signal or DOWN signal is output (one period is a period of one of external reference clock CLex (10) and internal clock CLin (11) which has the higher frequency). Reset signal NRO (47) is output one period after clock signal CK is output (one period is a period of one of external reference clock CLex (10) and internal clock CLin (11) which has the higher frequency), thereby resetting the clock counters 20 and 21 for a new frequency comparison.

The operation of the frequency comparator 7 is repeated until the inputs to the clock counters 20 and 21 are interrupted by frequency coincidence signal FSTOP input from the up/down counter 8.

Operation of Up/Down Counter

In the up/down counter 8, the adder 31 adds the output of the input control circuit 30 (a ½ value of the previous addition/subtraction result value) to the output of the register 33 which stores the count value. The result of the addition is latched by the register 33 when the register 33 receives clock signal CK from the OR circuit 22 of the frequency comparator 7.

The outputs of the input control circuit 30 of the up/down counter 8 is now described. Among n−1 logic circuits 53, i.e., among the logic circuits 53 corresponding to bits $I_1$ to $I_{n-1}$ of the input control circuit 30, a logic circuit 53 in which the level of A-terminal of the AND circuit 58 is "1" and the level of B-terminal of the AND circuit 58 is "0" outputs "1" when any of the UP signal and DOWN signal is "1". A logic circuit 53 in which the levels of A-terminal and B-terminal of the AND circuit 58 are both "1" outputs "0" when only the UP signal is "1" and outputs "1" when only the DOWN signal is "1". A logic circuit 53 in which the levels of A-terminal and B-terminal are both "0" outputs "0" irrespective of the values of the UP signal and DOWN signal. When the state transition circuit 51 is in the initial state immediately after being reset (i.e., the state where only the most significant bit $C_{n-1}$ is "1" and the other bits are "0"), bit $I_{n-1}$ is "1", the bits lower than bit $I_{n-1}$ are all "0", and the bits higher than bit $I_{n-1}$, i.e., bit $I_n$ and bit $I_{n+1}$, are "0" when the UP signal is input to the input control circuit 30 but "1" when the DOWN signal is input to the input control circuit 30. That is, in the initial state, as for the output of the input control circuit 30, the bits $I_{n+1}$ to $I_1$ are "0010 . . . 0" when the UP signal is "1", but the bits $I_{n+1}$ to $I_1$ are "1110 . . . 0" when the DOWN signal is "1".

Thereafter, when clock signal CK of the frequency comparator 7 is input to the input control circuit 30, the state transition circuit 51 transitions to a next state where the output state is such that bit $C_{n-1}$ and bit $C_{n-2}$ are "1", and bit $C_{n-3}$ and subsequent bits are "0". In this state, the output of the input control circuit 30 is "00010 . . . 0" when the UP signal is "1" but "11110 . . . 0" when the DOWN signal is "1".

Subsequent states where subsequent clock signals CK are input to the input control circuit 30 are now described likewise. Every time clock signals CK is input, the absolute value of the output value of the input control circuit 30 changes from the initial state to a ¼ of the maximum value $2^N$ of the up/down counter 8, a ⅛ of $2^N$ (i.e., a ½ of the previous addition/subtraction result value), a 1/16 of $2^N$ (i.e., a ½ of the previous addition/subtraction result value), . . . , and "1". The output of the input control circuit 30 is a positive value when the UP signal is input, but a negative value when the DOWN signal is input.

Herein, the absolute value in the initial state is not a ½ but a ¼ of the maximum value $2^N$, because the value of the register 33 is set to a ½ of the maximum value $2^N$ in the initial state.

Thus, after a frequency comparison is performed by the frequency comparator 7, the UP signal or DOWN signal is input to the up/down counter 8. When the UP signal is input, the output value of the input control circuit 30 is a positive value of a ½ of the previous addition/subtraction result value. When the DOWN signal is input, the output value of the input control circuit 30 is a negative value of a ½ of the previous addition/subtraction result value. The output value of the input control circuit 30 is added to the count value of the register 33, and the result of addition is input to the register 33 again. The register 33 receives from the frequency comparator 7 clock signal CK at the time delayed by one period (this "one period" is a period of one of external reference clock CLex (10) and internal clock CLin (11) which has the higher frequency) from the time when the UP signal or DOWN signal is output from the frequency comparator 7. At the time of receipt of clock signal CK, the register 33 latches the addition/subtraction result value of the adder 31. Thus, when the UP signal is input to the up/down counter 8, the count value of the up/down counter 8 increases by a ½ of the previous addition/subtraction result value. When the DOWN signal is input to the up/down counter 8, the count value of the up/down counter 8 decreases by a ½ of the previous addition/subtraction result value.

Thereafter, in the frequency comparator 7, reset signal NRO (47) is output from the clock counter 20 or 21 at the time delayed by one period (a period of one of external reference clock CLex (10) and internal clock CLin (11) which has the higher frequency) from the time when clock signal CK is output, and the clock counters 20 and 21 themselves are reset.

In response to a change in the count value of the up/down counter 8, the VCO characteristic control circuit 9 changes the V-F characteristic of the voltage controlled oscillator 5 according to the count value. As a result, the output frequency of the voltage controlled oscillator 5 is changed, and internal clock CLin (11) which is generated by dividing the output frequency of the voltage controlled oscillator 5 by the frequency divider circuit 6 is also changed.

In this way, in the frequency comparison loop, the frequency comparison of external reference clock CLex (10) with changed internal clock CLin (11) is carried out in the frequency comparator 7. According to the result of the comparison, the count value of the up/down counter 8 is incremented or decremented by a ½ of the previous count value. Such a frequency comparison operation based on a dichotomizing search method is repeated.

Then, in the state transition circuit 51 of the input control circuit 30 of the up/down counter 8, when clock signal CK is input from the frequency comparator 7 to the input control circuit 30 under the state where the least significant bit $C_1$ is "1" (i.e., the state where the up/down counter 8 is in the final step interval), the frequency comparison stop signal 16 output from the D-type flip flop circuit 54 of the input control circuit 30 is "1", and this signal 16 is input to the frequency comparator 7 and the operation mode switch 3. Therefore, the operation of the frequency comparator 7 is stopped, while the operation mode switch 3 is switched from the F-side to the P-side. As a result, the frequency comparison mode is ended, while the loop is switched to the phase comparison loop so that the phase comparison mode is selected.

As described above, according to the present embodiment, a frequency comparison based on a dichotomizing search method can be performed in a dual loop PLL. Thus, the frequency comparison operation is performed at a higher speed and with greater efficiency, and the lock up time is reduced, as compared with a conventional dual loop PLL including an up/down counter which operates on a step by step basis. For example, in the case where the number of bits of the up/down counter 8 is "3", the frequency comparison is required 8 times at maximum in a conventional technique. However, the present embodiment requires the frequency comparison only 3 times.

(Embodiment 2)

Next, a dual loop PLL of embodiment 2 of the present invention is described.

In the above-described dual loop PLL of embodiment 1, a frequency comparison is performed based on a dichotomizing search method. In the case of a frequency comparison loop, the absolute value of a variation in the frequency of the voltage controlled oscillator 5 is moderately decreased on a half-step by half-step basis. Thus, the frequency comparison accuracy required of the frequency comparator 7 can be decreased more at earlier steps of the frequency comparison. However, in the clock counter 20 of FIG. 2 which is included in the frequency comparator 7 of embodiment 1, the frequency comparison is performed always with the same frequency comparison accuracy (specifically, based on the count number of clock CK (43) in the clock counter 20) throughout the earlier steps (start period), intermediate steps, and final steps of the frequency comparison. Thus, in the earlier steps immediately after the start of the frequency comparison, the frequency comparison is performed with accuracy higher than necessary, i.e., an unnecessary frequency comparison time is consumed.

In view of such, according to embodiment 2, the clock counter 20 of FIG. 2 is improved such that the frequency comparison accuracy is variable. With such an improvement, the frequency comparison accuracy is adjusted to the least necessary level for the earlier steps, intermediate steps, and final steps of the frequency comparison, whereby the frequency comparison time is further reduced, and the lock up time is decreased.

Figure 4:
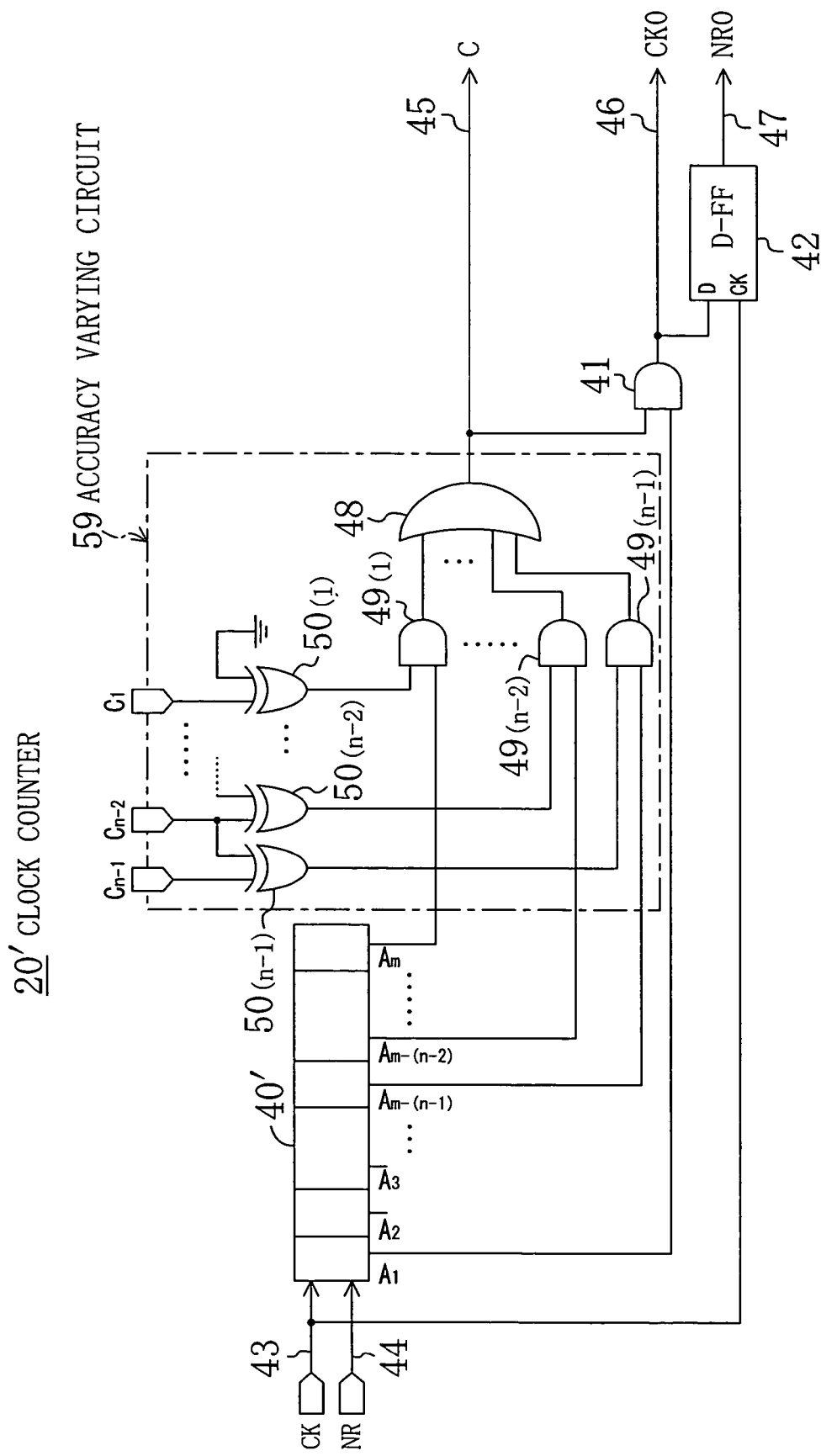
FIG. 4 shows a circuit structure of a clock counter included in a frequency comparator of a dual loop PLL according to embodiment 2 of the present invention.

FIG. 4 shows a specific structure of a clock counter 20' included in a frequency comparator 7 of a dual loop PLL of embodiment 2.

The clock counter 20' of FIG. 4 includes an accuracy varying circuit 59 for varying the frequency comparison accuracy for respective steps of the dichotomizing search process of the frequency comparison. The accuracy varying circuit 59 receives output signals $C_{n-1}, C_{n-2}, \ldots,$ and $C_1$ of n−1 bits which are output from the state transition circuit 51 of the input control circuit 30 shown in FIG. 3. The accuracy varying circuit 59 includes two-input exclusive OR circuits 50(n−1), 50(n−2), . . . , and 50(1) up to the number equal to the number of bits of the output signals (=n−1), and the same number of two-input AND circuits 49(n−1), 49(n−2), . . . , and 49(1), and one OR circuit 48. On the other hand, a counter 40' is formed by a m-bit counter (m is a positive value greater than n).

In the accuracy varying circuit 59, each of the exclusive OR circuits 50(n−1) to 50(2) receives the output of a corresponding bit of the state transition circuit 51 and the output of a bit immediately previous to the corresponding bit. The value "0" (ground potential) is input to the exclusive OR circuit 50(1) which receives output $C_1$ of the least significant bit of the state transition circuit 51. Each of the AND circuits 49(n−1) to 49(1) receives the output of a corresponding one of the exclusive OR circuits 50(n−1) to 50(1). The n−1 AND circuits 49(n−1) to 49(1) correspond to the n−1 higher bits of the counter 40', i.e., bits Am-(n−1) to Am, and receives the output of corresponding bits. Specifically, the output of bit Am-(n−1) of the counter 40' is input to the AND circuit 49(n−1) corresponding to the most significant bit, and the output of the most significant bit Am of the counter 40' is input to the AND circuit 49(1) corresponding to the least significant bit. The outputs of the AND circuits 49(n−1) to 49(1) are input to the OR circuit 48, and the output of the OR circuit 48 is the C-signal (45) output from the frequency comparator 7 (UP signal or DOWN signal).

Thus, according to embodiment 2, outputs $C_{n-1}$ to $C_1$ of the state transition circuit 51 subsequently change at every frequency comparison step (i.e., at every output of the UP signal or DOWN signal from the clock counter 20'), from the initial reset state, i.e., "100 . . . 0", to "110 . . . 0", and "111 . . . 0", finally resulting in "111 . . . 1". Thus, the combination of the outputs of the exclusive OR circuits 50(n−1) to 50(1) changes from the initial reset state to "100 . . . 0", "010 . . . 0", . . . , and finally resulting in "000 . . . 1". As a result, at the first step of the frequency comparison, the output of the AND circuit 49(n−1) corresponding to the most significant bit becomes High according to the output of bit Am-(n−1) of the counter 40', so that the OR circuit 48 outputs the C-signal (45) (UP signal or DOWN signal). Then, at the second step, the C-signal (45) (UP signal or DOWN signal) is output for a bit at a one bit higher place of the counter 40', i.e., bit Am-(n−2). Then, at the third step, the C-signal (45) (UP signal or DOWN signal) is output for a bit at a one bit higher place of the counter 40', i.e., bit Am-(n−3). Then, at the final step, the output of the AND circuit 49(1) at the least significant bit becomes High according to the output of the most significant bit Am of the counter 40', so that the C-signal (45) (UP signal or DOWN signal) is output from the OR circuit 48.

Thus, every time the frequency comparison proceeds by one step, the number of counts which is used for the frequency comparison is doubled, and accordingly, the frequency comparison accuracy increases by a factor of 2. Explaining in view of the opposite direction, the comparison accuracy decreases stepwise by a factor of 2 toward the earlier steps of the frequency comparison. Therefore, the accuracy is made lower at the earlier steps of the frequency comparison by using the frequency comparator 7 which includes the clock counter 20' of embodiment 2. Therefore, the frequency comparison accuracy is adjusted to the least necessary level at each step of the frequency comparison, such that the frequency comparison is performed more efficiently.

(Embodiment 3)

Next, a dual loop PLL of embodiment 3 of the present invention is described.

Figure 5:
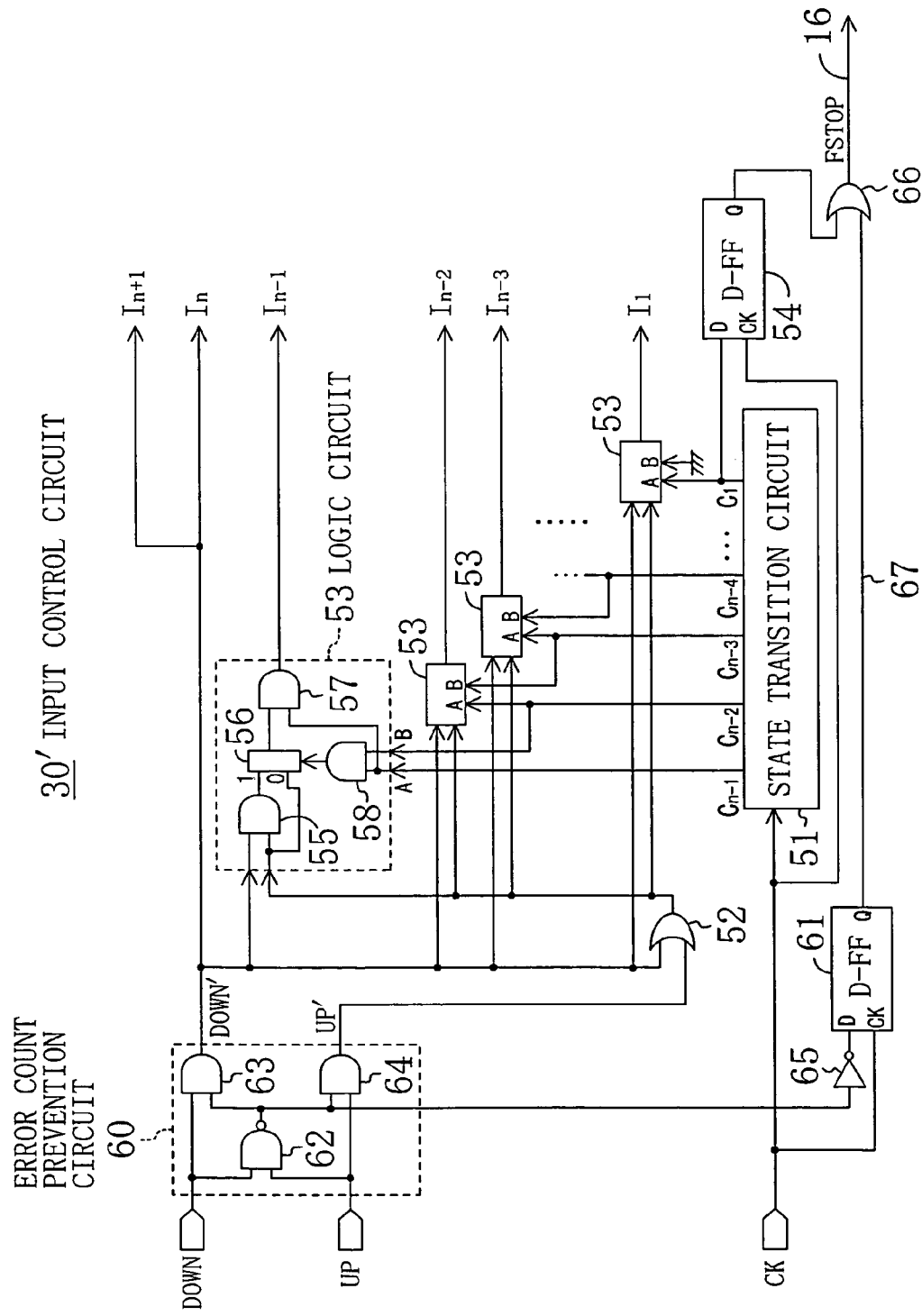
FIG. 5 shows a circuit structure of an input control circuit included in an up/down counter of a dual loop PLL according to embodiment 3 of the present invention.

FIG. 5 shows an internal structure of an input control circuit of an up/down counter included in the dual loop PLL of embodiment 3. The internal structure of the up/down counter and the other components including a frequency comparator, and the like, are the same as those of the dual loop PLL of embodiment 1 except for the input control circuit, and descriptions and illustration thereof are herein omitted.

In the input control circuit 30 of embodiment 1 shown in FIG. 3, when both the UP signal and DOWN signal, which are output from the frequency comparator 7, are "1" at the same time, the output of the input control circuit 30 is the same as that output when only the DOWN signal is input to the input control circuit 30, and in such a case, a down count (decrement) is erroneously performed. Before clock signal CK is output from the frequency comparator 7, the UP signal and DOWN signal are simultaneously input to the input control circuit 30 only when the frequencies of external reference clock CLex (10) and internal clock CLin (11) are substantially equal. In this case, none of an up count (increment) or a down count (decrement) should be performed. According to embodiment 3, an improvement is made to the input control circuit 30 of FIG. 3 so as to overcome such a problem.

In FIG. 5, the input control circuit 30' includes an error count prevention circuit 60, a D-type flip flop circuit 61 and an OR circuit 66 in addition to the components of the input control circuit 30 of FIG. 3 described in embodiment 1.

The error count prevention circuit 60 includes a NAND circuit 62 and two AND circuits 63 and 64. The NAND circuit 62 receives the UP signal and DOWN signal. The AND circuit 63 receives the DOWN signal and the output of the NAND circuit 62 and outputs a DOWN' signal. The AND circuit 64 receives the UP signal and the output of the NAND circuit 62 and outputs an UP' signal. With this arrangement, the error count prevention circuit 60 operates such that both the UP' signal and DOWN' signal are "0" when both the UP signal and DOWN signal are "1" at the same time.

The D-type flip flop circuit 61 receives as a data input a signal generated by inverting the output of the NAND circuit 62 by an inverter 65, i.e., the logical product of the UP signal and DOWN signal. The D-type flip flop circuit 61 further receives clock signal CK as a clock input. The D-type flip flop circuit 61 latches the state where both the UP signal and DOWN signal are "1" to output a frequency coincidence signal 67.

The OR circuit 66 receives the frequency coincidence signal 67 from the D-type flip flop circuit 61 and an output signal 68 from the previously-described D-type flip flop circuit 54 (a signal output when the D-type flip flop circuit 54 operates at a final step interval) and outputs frequency comparison stop signal FSTOP (16).

Thus, according to embodiment 3, before the end of the frequency comparison based on a dichotomizing search method, in a frequency coincidence state where the UP signal and DOWN signal are "1" at the same time in the frequency comparator 7, the error count prevention circuit 60 sets both the UP' signal and DOWN' signal to "0". Thus, none of an up count (increment) and a down count (decrement) is performed, whereby an error count is prevented.

The above frequency coincidence state is latched by the D-type flip flop circuit 61 at the time when clock signal CK is output from the frequency comparator 7, and the frequency coincidence signal 67 is output. Since the frequency comparison stop signal FSTOP (16) output from the OR circuit 66 is the logical sum of the frequency coincidence signal 67 and the signal 68 which is output from the D-type flip flop circuit 54 when the D-type flip flop circuit 54 operates at the final step interval, frequency comparison stop signal FSTOP (16) is "1" when the frequency comparison based on a dichotomizing search method is completed or when the frequencies of external reference clock CLex (10) and internal clock CLin (11) are substantially equal. That is, according to embodiment 3, in the case where the frequencies becomes substantially equal in the midst of the dichotomizing search, and the UP signal and DOWN signal are simultaneously input before clock signal CK is input from the frequency comparator 7, an error count in the up/down counter 8 is prohibited, whereby the frequency comparison mode is stopped. Thus, the number of times of the frequency comparison is further reduced, and the frequency comparison is performed more efficiently.

(Embodiment 4)

Next, a dual loop PLL of embodiment 4 of the present invention is described.

Figure 6:
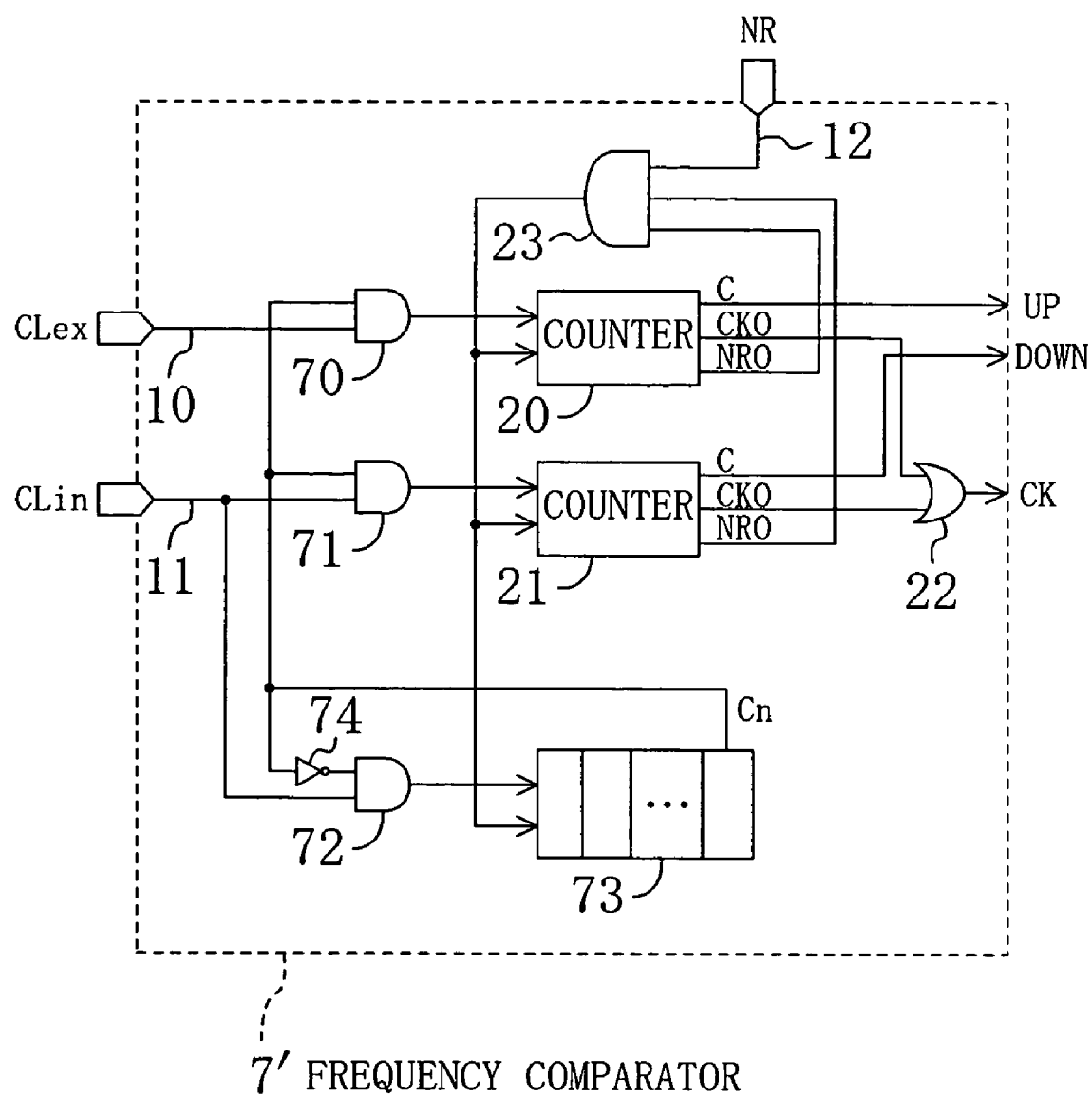
FIG. 6 shows a circuit structure of a frequency comparator included in a dual loop PLL according to embodiment 4 of the present invention.

FIG. 6 shows an internal structure of a frequency comparator 7' included in the dual loop PLL of embodiment 4. The components of the dual loop PLL of embodiment 4 are the same as those of the dual loop PLL of embodiment 1 except for the frequency comparator 7', and thus, descriptions and illustration thereof are herein omitted.

In embodiment 1, when the count value of the up/down counter 8 is changed in the frequency comparison loop so that the V-F characteristic of the voltage controlled oscillator 5 is shifted by the VCO characteristic control circuit 9, the output frequency of the voltage controlled oscillator 5 is transient until it becomes stationary, and accordingly, internal clock CLin (11) which is generated by dividing the output frequency of the voltage controlled oscillator 5 by the frequency divider circuit 6 is transient. Thus, in such a structure wherein the frequency comparator 7 compares the transient frequency with the frequency of external reference clock CLex (10), the frequency comparison operation of the frequency comparator 7 is unstable. According to embodiment 4, the frequency comparison is forcedly prohibited until the frequency of internal clock CLin (11) becomes stable.

Specifically, the frequency comparator 7' of FIG. 6 includes three AND circuits 70, 71 and 72, and a counter 73 in addition to the components of the frequency comparator 7 shown in FIG. 1. The counter 73 is reset based on reset signals NRO output from the clock counters 20 and 21. After being reset, the counter 73 counts internal clock CLin (11), and when it reaches a predetermined count number, the counter 73 changes the most significant bit $C_n$ to "1". The AND circuit 72 receives internal clock CLin (11) and a MSB negation signal generated by inverting the most significant bit $C_n$ of the counter 73 by an inverter 74. The output of the AND circuit 72 is input to the counter 73. The AND circuit 70 receives external reference clock CLex (10) and the most significant bit $C_n$ of the counter 73. The output of the AND circuit 70 is input to the clock counter 20. The AND circuit 71 receives internal clock CLin (11) and the most significant bit $C_n$ of the counter 73. The output of the AND circuit 71 is input to the clock counter 21.

Thus, according to embodiment 4, during a period when the V-F characteristic of the voltage controlled oscillator 5 is shifted so that the output frequency of the voltage controlled oscillator 5 is transient, i.e., until the counter 73 counts internal clock CLin (11) up to a predetermined clock number, the frequency comparison operation is not performed in the frequency comparator 7'. Thereafter, the output frequency becomes stable, and at this point in time, external reference clock CLex (10) and internal clock CLin (11) are input for the first time to the clock counters 20 and 21, respectively, and the frequency comparison operation is started. Thus, the frequency comparison is performed without the influence of transient internal clock CLin (11) which occurs when the V-F characteristic of the voltage controlled oscillator 5 is shifted.

(Embodiment 5)

Next, a dual loop PLL of embodiment 5 of the present invention is described.

In the dual loop PLL of embodiment 1 shown in FIG. 1, when the frequency comparison mode is selected, the operation mode switch 3 is switched to the F-side to supply reference voltage Vref (15) to the loop filter 4, whereby a predetermined voltage is supplied as the input voltage to the voltage controlled oscillator 5. In this structure, the loop filter 4 is a load on a circuit for generating reference voltage Vref (15). Thus, it takes a certain time until the voltage input to the voltage controlled oscillator 5 reaches a predetermined voltage, and as a result, it takes a certain time until the output of the voltage controlled oscillator 5 becomes stable. In embodiment 5, an improvement is made to the circuit structure of the dual loop PLL of FIG. 1 in order to overcome such an inconvenience.

Figure 7:
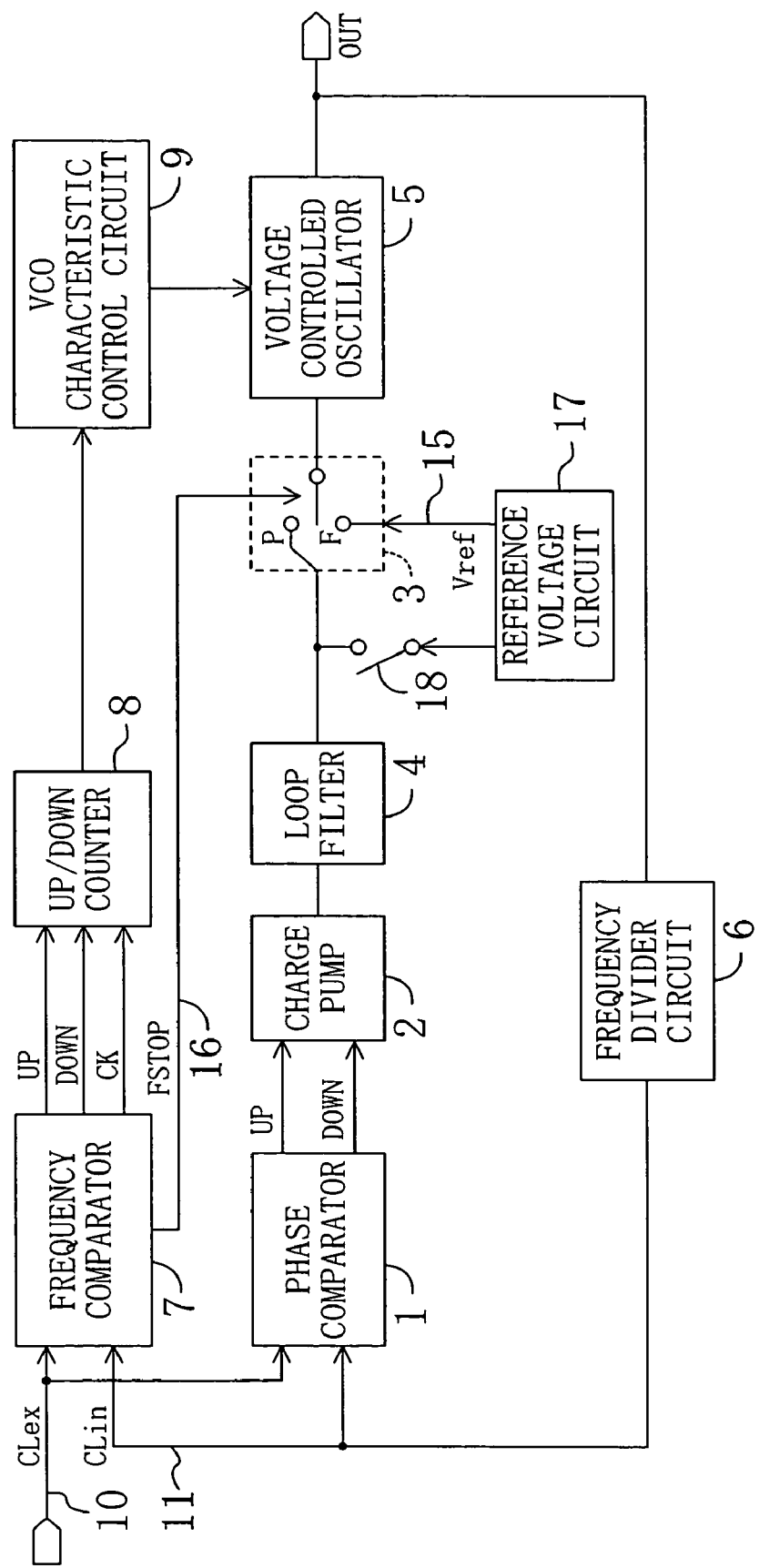
FIG. 7 shows a circuit structure of a dual loop PLL according to embodiment 5 of the present invention.

FIG. 7 shows a structure of a dual loop PLL of embodiment 5. The dual loop PLL shown in FIG. 7 is different from that of embodiment 1 shown in FIG. 1 in that the position of the operation mode switch 3 is changed to a stage subsequent to the loop filter 4, and that a reference voltage circuit 17 and a switch 18 are further provided. The other components, e.g., the frequency comparator 7, and the like, are the same as those of the dual loop PLL of embodiment 1, and therefore, descriptions and illustration thereof are herein omitted.

In FIG. 7, the reference voltage circuit 17 generates reference voltage Vref (15), which is supplied to the F-side of the operation mode switch 3 and to the loop filter 4 through the switch 18. The switch 18 is ON (closed) in the frequency comparison mode but is OFF (open) in the phase comparison mode.

In FIG. 7, the operation mode switch 3 is switched to the F-side when the frequency comparison mode is selected, so that the loop filter 4 placed at the stage previous to the voltage controlled oscillator 5 is disconnected from the voltage controlled oscillator 5, and reference voltage Vref (15) having a predetermined value, which is generated by the reference voltage circuit 17, is directly supplied as the input voltage to the voltage controlled oscillator 5. Thus, comparing with the dual loop PLL shown in FIG. 1, the loop filter 4 does not constitute the load on the reference voltage circuit 17. That is, the load on the reference voltage circuit 17 is reduced. Therefore, according to embodiment 5, the voltage input to the voltage controlled oscillator 5 quickly reaches the level of reference voltage Vref (15). As a result, the transient variation time of the output frequency of the voltage controlled oscillator 5 at the initial operation steps is reduced, and the influence of the transient state at the initial operation steps on the frequency comparison is reduced.

In the frequency comparison mode, the switch 18 is turned ON (closed) so that the loop filter 4 disconnected from the voltage controlled oscillator 5 is connected to the reference voltage circuit 17. Thus, reference voltage Vref (15), which is at the same level as that of the voltage input to the voltage controlled oscillator 5, is supplied to the loop filter 4, and the voltage level of the loop filter 4 reaches the level of reference voltage Vref (15) within the frequency comparison mode period.

Thereafter, the dual loop PLL transitions to the phase comparison mode, the switch 18 is turned OFF (open), so that the loop filter 4 is disconnected from the reference voltage circuit 17. The loop filter 4 is connected to the voltage controlled oscillator 5 by switching the operation mode switch 3 to the P-side. Therefore, in embodiment 5, the voltage input to the voltage controlled oscillator 5 does not vary even when the dual loop PLL transitions from the frequency comparison mode to the phase comparison mode. Thus, it is possible to immediately start the phase comparison even at the time when the frequencies of external reference clock CLex (10) and internal clock CLin (11) are substantially equal. Therefore, even when the loop filter 4 is disconnected from the input side of the voltage controlled oscillator 5 in the frequency comparison mode, and reference voltage Vref (15) is supplied to the input side of the voltage controlled oscillator 5, the dual loop PLL smoothly transitions to the phase comparison mode, and the time spent for the frequency comparison is efficiently decreased.

(Embodiment 6)

Next, a dual loop PLL according to embodiment 6 of the present invention is described.

Embodiment 6 intends to make a modification to embodiment 1 shown in FIG. 1 such that, in the case where reference voltage Vref (15) deviates from a predetermined value due to variations in a production process of the reference voltage circuit 17, or the like, the voltage which is input to the voltage controlled oscillator 5 during the dual loop PLL being locked is prevented from excessively increasing or decreasing.

Figure 8:
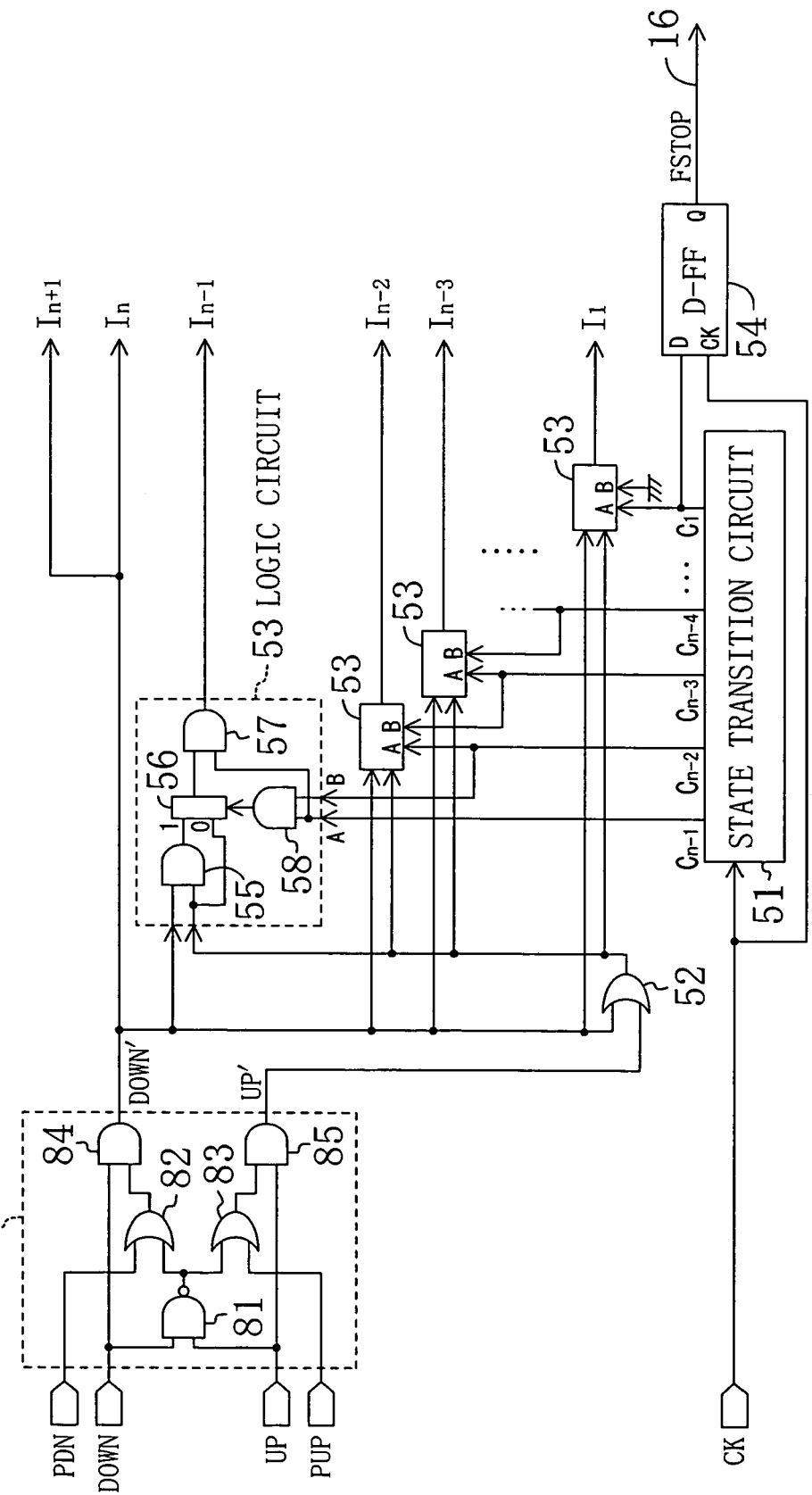
FIG. 8 shows a circuit structure of an input control circuit included in an up/down counter of a dual loop PLL according to embodiment 6 of the present invention.

FIG. 8 shows an internal structure of an input control circuit 30" included in an up/down counter 8 of a dual loop PLL of embodiment 6. The internal structure of the up/down counter 8 and the other components, e.g., the frequency comparator 7, and the like, are the same as those of the dual loop PLL of embodiment 1 except for the input control circuit 30", and therefore, descriptions and illustration thereof are herein omitted.

In FIG. 8, the input control circuit 30" includes a priority switch circuit 80 in addition to the input control circuit 30 of FIG. 3 which has been described in embodiment 1.

The priority switch circuit 80 includes a NAND circuit 81, two OR circuits 82 and 83, and two AND circuits 84 and 85. The priority switch circuit 80 receives DOWN priority signal PDN and UP priority signal PUP. The NAND circuit 81 receives the DOWN signal and UP signal from the frequency comparator 7 shown in FIG. 1. The OR circuit 82 receives the output of the NAND circuit 81 and DOWN priority signal PDN. The OR circuit 83 receives the output of the NAND circuit 81 and UP priority signal PUP. The AND circuit 84 receives the output of the OR circuit 82 and the DOWN signal, and outputs a DOWN' signal. The AND circuit 85 receives the output of the OR circuit 83 and the UP signal, and outputs an UP' signal.

In the priority switch circuit 80 having the above structure, if the frequencies of external reference clock CLex (10) and internal clock CLin (11) come close to each other so that the DOWN signal and UP signal are simultaneously input from the frequency comparator 7 to the priority switch circuit 80, i.e., the frequencies of external reference clock CLex (10) and internal clock CLin (11) (reference frequency and output frequency) are equal, the output of the NAND circuit 81 is Low. If the UP signal is required to have priority over the DOWN signal, UP priority signal PUP is set to High and DOWN priority signal PDN is set to Low. Accordingly, the UP' signal becomes High and the DOWN' signal becomes Low, so that the UP signal has priority over the DOWN signal. On the other hand, if the DOWN signal is required to have priority over the UP signal, DOWN priority signal PDN is set to High and UP priority signal PUP is set to Low. Accordingly, the DOWN' signal becomes High and the UP' signal becomes Low, and thus, the DOWN signal has priority over the UP signal.

In the case where monitored reference voltage Vref (15) becomes higher than the predetermined voltage due to variations in the production process, the priority switch circuit 80 gives priority to the UP signal, whereby the frequency of internal clock CLin (11) is higher than that of external reference clock CLex (10) at the end of the frequency comparison. Thus, in the phase comparison subsequently performed, the voltage input to the voltage controlled oscillator 5 such that decrease the frequency of internal clock CLin (11) is decreased. In the end, the voltage which is input to the voltage controlled oscillator 5 during the dual loop PLL being locked decreases to a voltage level lower than increasingly deviated reference voltage Vref (15), which is substantially equal to the predetermined value. Alternatively, in the case where monitored reference voltage Vref (15) becomes lower than the predetermined voltage, the priority switch circuit 80 gives priority to the DOWN signal, whereby the voltage which is input to the voltage controlled oscillator 5 during the dual loop PLL being locked increases to a voltage level higher than decreasingly deviated reference voltage Vref (15), which is substantially equal to the predetermined value.

Thus, according to embodiment 6, even when reference voltage Vref (15) deviates from the predetermined voltage due to process variations, the priority switch circuit 80 gives priority to the UP signal or DOWN signal, whereby the voltage which is input to the voltage controlled oscillator 5 during the dual loop PLL being locked is prevented from excessively increasing or decreasing. Thus, reference voltage Vref (15) is adjusted to a desired voltage level having desirable characteristics.

(Embodiment 7)

Next, a dual loop PLL according to embodiment 7 of the present invention is described.

Figure 9:
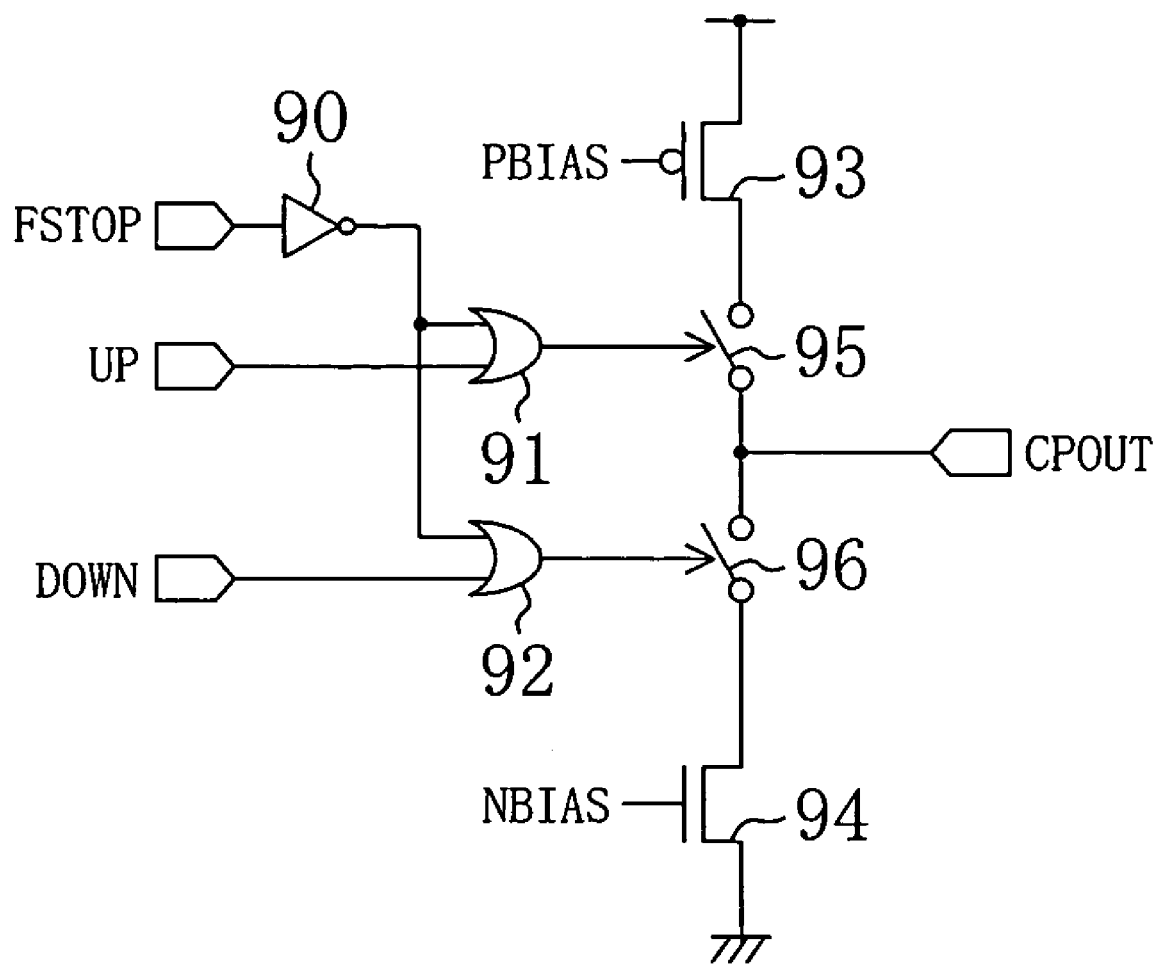
FIG. 9 shows a circuit structure of a charge pump included in a dual loop PLL according to embodiment 7 of the present invention.
Figure 10:
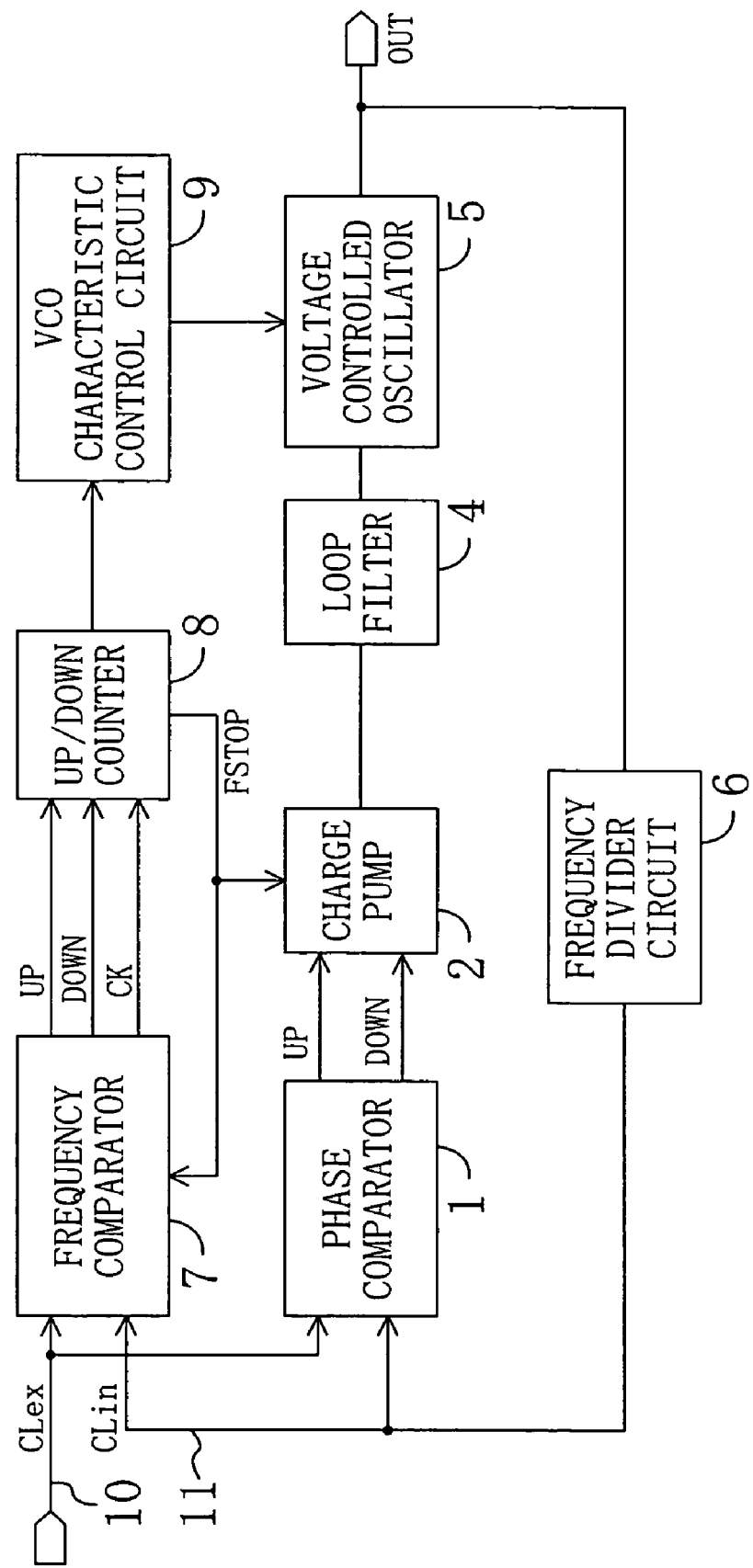
FIG. 10 shows a circuit structure of the dual loop PLL including the charge pump according to embodiment 7 of the present invention.

FIG. 9 shows an internal structure of a charge pump 2 included in the dual loop PLL of embodiment 7. FIG. 10 shows an entire structure of the dual loop PLL including the charge pump 2.

In the dual loop PLL of FIG. 10, the charge pump 2 is placed at a stage subsequent to the phase comparator 1 and has the internal structure shown in FIG. 9. The charge pump 2 includes two OR circuits 91 and 92, a Pch transistor 93 for determining a charging current of the charge pump 2, a Nch transistor 94 for determining a discharging current of the charge pump 2, and two switches 95 and 96. The gate voltages of the Pch transistor 93 and Nch transistor 94 are biased such that the charging current and the discharging current of the charge pump 2 becomes equal to each other.

The two OR circuits 91 and 92 receive frequency comparison stop signal FSTOP (16) from the up/down counter 8 through an inverter 90. The OR circuit 91 receives the UP signal from the phase comparator 1. The OR circuit 92 receives the DOWN signal from the phase comparator 1. The switch 95 is controlled according to the output of the OR circuit 91 to interrupt the charging current. The switch 96 is controlled according to the output of the OR circuit 92 to interrupt the discharging current.

In the charge pump 2 of embodiment 7, when the frequency comparison mode is selected, i.e., when frequency comparison stop signal FSTOP (16) is "0", both the switches 95 and 96 are ON (closed), so that a voltage which is about a ½ of the supply voltage is output as reference voltage Vref from output terminal CPout. This reference voltage Vref is input to the loop filter 4.

On the other hand, consider a case where frequency comparison stop signal FSTOP (16) is changed to "1" so that the dual loop PLL transitions to the phase comparison mode. When the UP signal is input from the phase comparator 1, only the switch 95 is turned ON so that the charging operation is performed. When the DOWN signal is input from the phase comparator 1, only the switch 96 is turned ON so that the discharging operation is performed.

Thus, the dual loop PLL of embodiment 7 has the function of an operation mode switch in the charge pump 2. Therefore, as seen from comparison of FIG. 10 of embodiment 7 and FIG. 1, the operation mode switch 3 and reference voltage Vref (15) may be omitted. Thus, in the dual loop PLL of embodiment 7, the operation mode switch 3 and the reference voltage circuit for generating reference voltage Vref (15), which have been shown in FIG. 1, may be omitted, and the effects of reducing the circuit area and power consumption are achieved.

Figure 13:
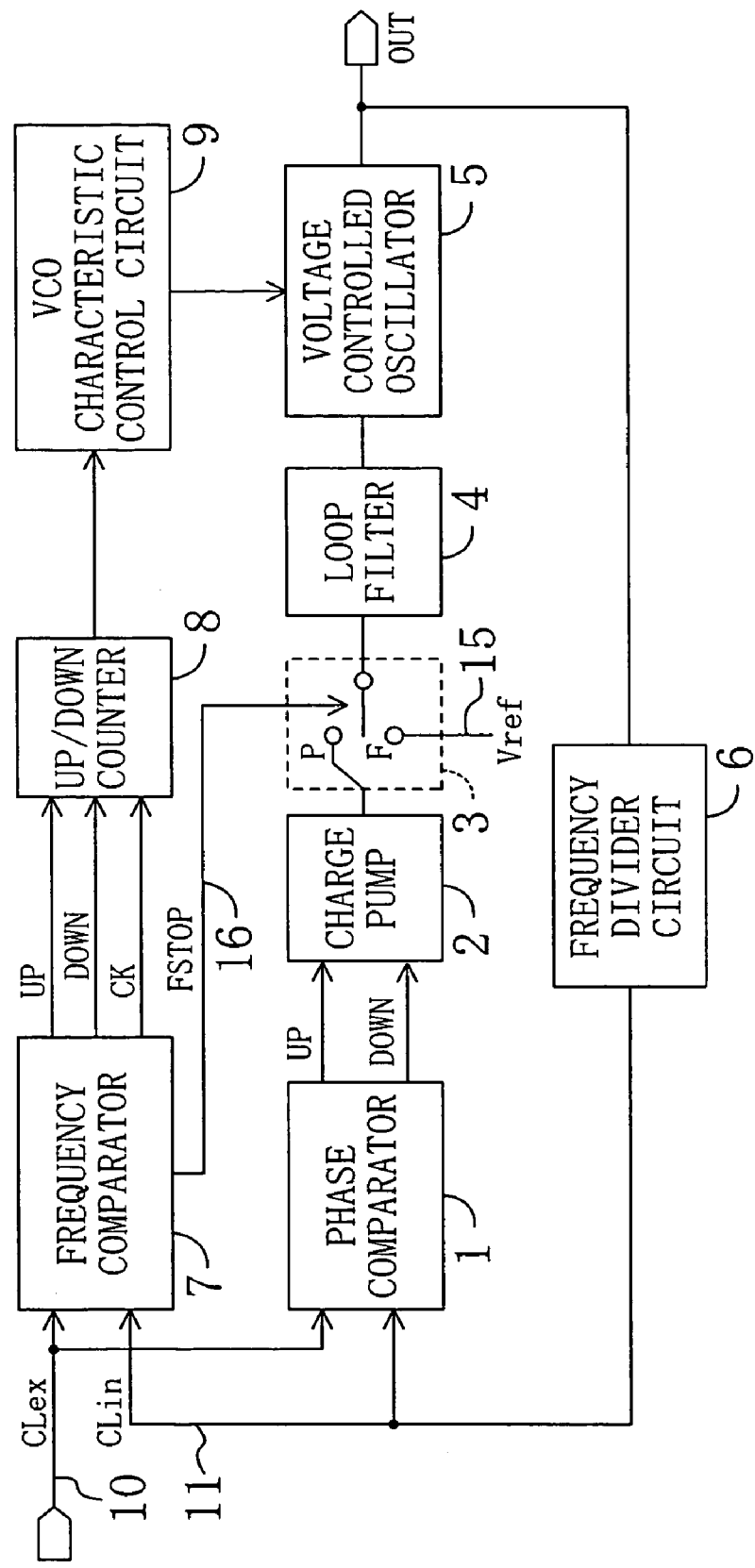
FIG. 13 is a block diagram showing a circuit structure of a conventional dual loop PLL.

Embodiment 7 has been applied to the loop filter of the dual loop PLL shown in FIG. 1. However, as a matter of course, the present invention may be applied to the charge pump of the conventional dual loop PLL shown in FIG. 13.

(Embodiment 8)

Next, a dual loop PLL according to embodiment 8 of the present invention is described.

Figure 11A:
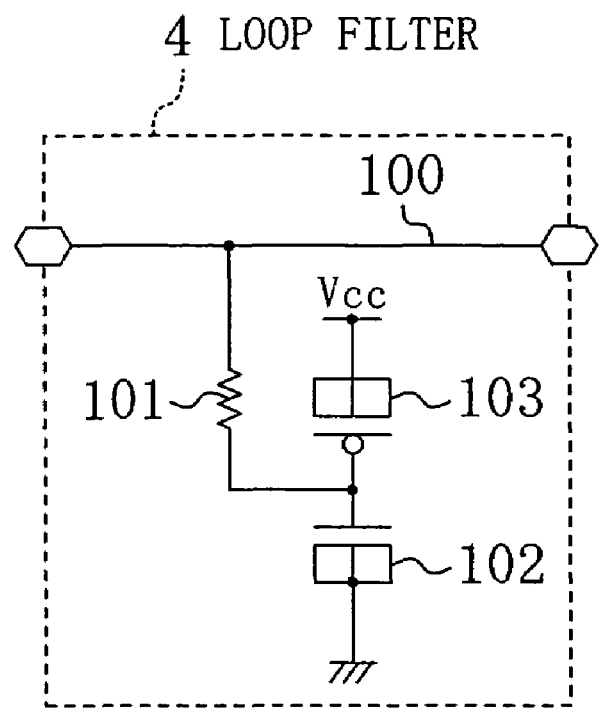
FIG. 11(a) shows a circuit structure of a loop filter included in a dual loop PLL according to embodiment 8 of the present invention.
Figure 11B:
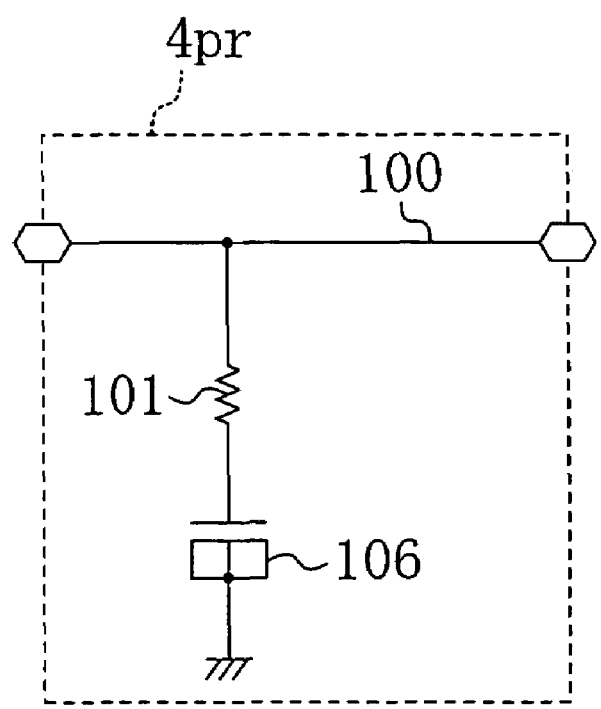
FIG. 11(b) shows a circuit structure of a loop filter of a conventional dual loop PLL.

FIG. 11(*a*) shows an internal structure of a loop filter 4 included in the dual loop PLL of embodiment 8. The components other than the loop filter 4 are the same as those of the dual loop PLL of embodiment 1, and therefore, descriptions and illustration thereof are herein omitted.

A structure of the loop filter 4 described in embodiment 8 is suitable for the dual loop PLL quickly recovering from a power down mode (i.e., operation mode wherein the operation is stopped to suppress power consumption) to the normal operation.

In FIG. 11(*a*), the loop filter 4 includes a terminal 100 connected to the output side of the charge pump 2 and the input side of the voltage controlled oscillator 5 (see FIG. 1), a resistor 101 one end of which is connected to the terminal 100, and a Nch-type transistor 102 and a Pch-type transistor 103 whose gate terminals are connected to the other end of the resistor 101. The Nch-type transistor 102 has a source terminal, a drain terminal and a bulk terminal which are connected to the ground. The Pch-type transistor 103 has a source terminal, a drain terminal and a bulk terminal which are connected to the power supply Vcc.

A structure of a conventional loop filter is shown in FIG. 11(*b*). This conventional loop filter 4*pr* includes a terminal 100 which is connected to the output side of the charge pump 2 and the input side of the voltage controlled oscillator 5 (see FIG. 1), and a resistor 101 and a Nch-type transistor 106 which are placed between the terminal 100 and the ground. The MOS capacitance of the Nch-type transistor 106 constitutes the capacitance of the loop filter 4*pr*.

Figure 12A:
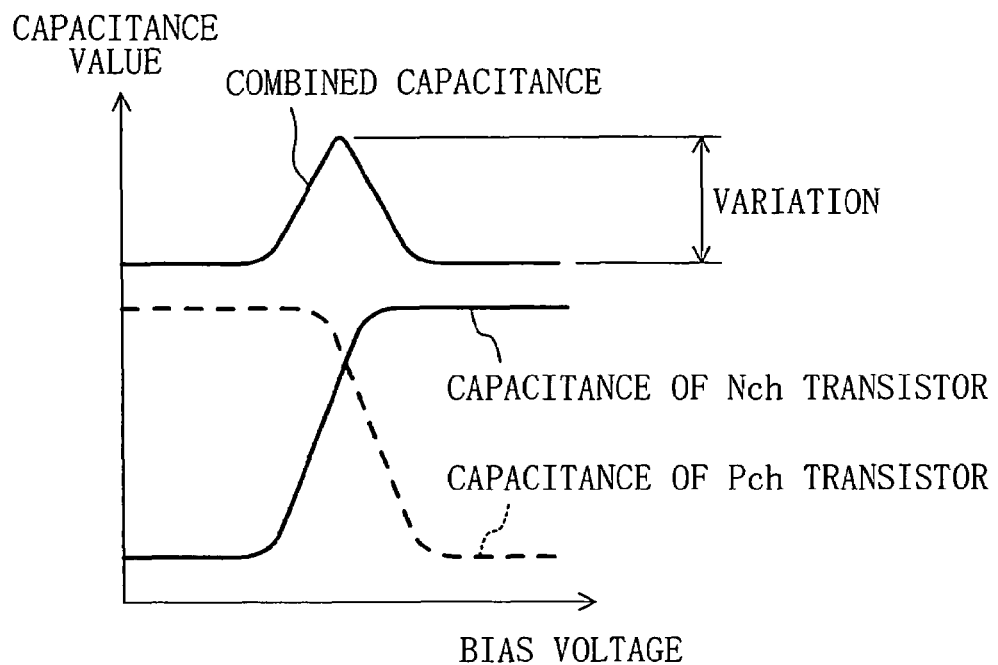
FIG. 12(a) shows a voltage characteristic of MOS capacitance in a loop filter of a dual loop PLL according to embodiment 8 of the present invention.
Figure 12B:
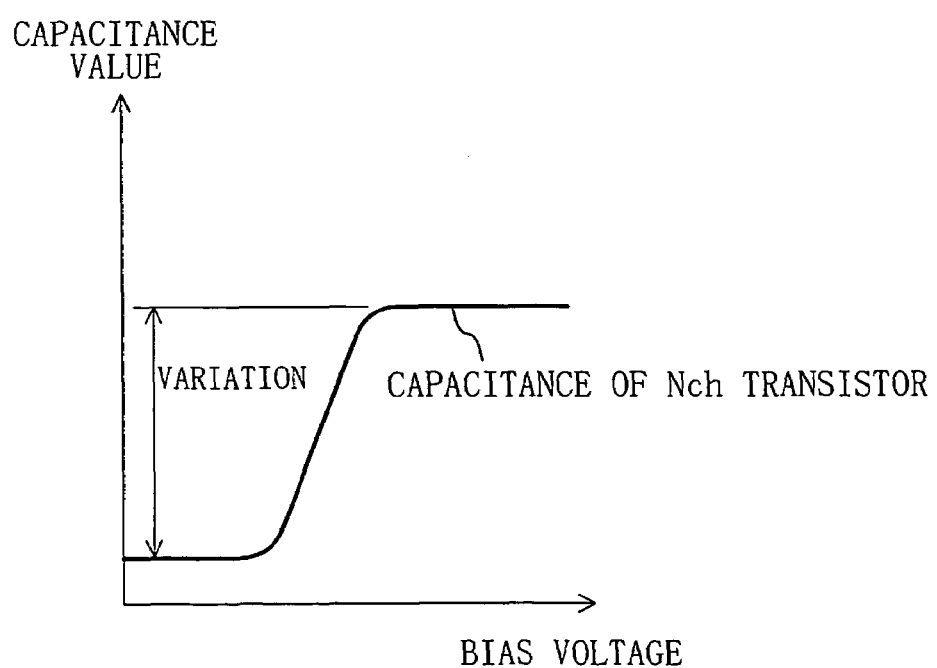
FIG. 12(b) shows a voltage characteristic of MOS capacitance in a loop filter of a conventional dual loop PLL.

In the conventional loop filter 4*pr*, in the power down mode, the potential of the terminal 100 of the loop filter 4*pr* decreases with the passage of time due to influence of a leaked current from the Nch-type transistor 106. Thus, when the dual loop PLL transitions from the power down mode to the normal operation, a certain time is spent until the dual loop PLL is locked because the oscillation frequency of the voltage controlled oscillator 5 decreases due to a decrease in the potential of the loop filter 4*pr*. Moreover, when the loop filter 4*pr* operates with a low supply voltage, the voltage range of the supply voltage is such that a variation in the MOS capacitance in the loop filter 4*pr* is large with respect to the bias voltage as shown in FIG. 12(*b*). Thus, in such a case, it is difficult to appropriately design the dual loop PLL.

On the other hand, in the loop filter 4 of embodiment 8, even in the presence of a leaked current flowing from the Nch-type transistor 102 to the ground, the leaked current is cancelled by a leaked current flowing from the Pch-type transistor 103 connected to the supply voltage Vcc to the Nch-type transistor 102. Thus, the potential of the terminal 100 of the loop filter 4 is unlikely to decrease. Therefore, in the loop filter 4 of embodiment 8, the potential of the terminal 100 of the loop filter 4 is kept at a generally constant potential for a long time in the power down mode as compared with the conventional loop filter 4*pr*. As a result, when the dual loop PLL transitions from the power down mode to the normal operation, the loop filter 4 can be locked within a short period of time as compared with the conventional loop filter 4*pr*.

Furthermore, in the loop filter 4 of embodiment 8, the capacitance of the loop filter 4 is a combined capacitance of the MOS capacitance of the Nch-type transistor 102 and the MOS capacitance of the Pch-type transistor 103 as shown in FIG. 12(*a*). Thus, a variation in the combined MOS capacitance with respect to the bias voltage is reduced to a half of the capacitance variation of the conventional loop filter 4*pr* shown in FIG. 12(*b*).

Embodiment 8 has been applied to the loop filter 4 of the dual loop PLL shown in FIG. 1. However, as a matter of course, the present invention may be applied to the loop filter of the conventional dual loop PLL shown in FIG. 13 or a loop filter included in a single loop type PLL.

INDUSTRIAL APPLICABILITY

As described above, in a dual loop PLL of the present invention, the frequency comparison in a frequency comparison loop is performed based on a dichotomizing search method. Thus, the frequency comparison is efficiently performed, and the lock up time is effectively reduced. Further, time reduction is possible when it is necessary to increase the output frequency up to the maximum frequency. Therefore, it is preferable that the present invention is applied to a dual loop PLL.

According to the present invention, the frequency comparison in the frequency comparison loop is performed based on a dichotomizing search method, and the frequency comparison accuracy is variable for respective steps of the frequency comparison along with the progress of the dichotomizing search. The time required for the frequency comparison in each step can be reduced, and the lock up time can be further reduced. Thus, it is preferable that the present invention is applied to a dual loop PLL.

According to the present invention, when the output frequency is equal to the reference frequency before the frequency comparison based on the dichotomizing search method is not completed, none of an up count (increment) and a down count (decrement) of a count value in an up/down counter is forcedly prohibited, whereby an error count is prevented. Moreover, at this point in time, the frequency comparison mode can be ended at earlier steps. Thus, it is preferable that the present invention is applied to a dual loop PLL.

In addition, according to the present invention, the frequency comparison is not performed during the period when a voltage controlled oscillator controls a variation in the output frequency. Thus, the frequency comparison is always performed with the stable output frequency and the reference frequency, and a desirable frequency comparison is secured. Thus, it is preferable that the present invention is applied to a dual loop PLL.

According to the present invention, when the frequency comparison loop is formed, the reference voltage of a reference voltage circuit is directly supplied to the voltage controlled oscillator. Thus, the loop filter does not constitute a load, and the load on the reference voltage circuit is reduced. Moreover, when the frequency comparison loop is formed, the reference voltage of the reference voltage circuit is also supplied to the loop filter. Therefore, transition from the frequency comparison loop to the phase comparison loop is smoothly achieved, and the time required for the phase comparison can be reduced. Thus, it is preferable that the present invention is applied to a dual loop PLL.

According to the present invention, even when the reference voltage supplied to the voltage controlled oscillator deviates from a predetermined value due to variations in the production process, a priority switch circuit give priority to a UP signal or DOWN signal, whereby the voltage which is input to the voltage controlled oscillator during the PLL being locked is adjusted to a desirable reference voltage level. Thus, it is preferable that the present invention is applied to a dual loop PLL.

In addition, according to the present invention, the function of an operation mode switch, which switches the operation mode between the frequency comparison mode and the phase comparison mode, and the function of a reference voltage generation circuit are realized by a charge pump. Accordingly, the structure of the dual loop PLL is simplified. Thus, it is preferable that the present invention is applied to a dual loop PLL.

According to the present invention, a P-type transistor is provided in the loop filter in addition to a N-type transistor. In the power down mode, a leaked current flowing from the N-type transistor to the ground is cancelled by a leaked current flowing from the P-type transistor to the N-type transistor. Thus, the potential of the loop filter is maintained at a substantially constant potential for a long time period. After the PLL transitions from the power down mode to the normal operation, locking of the PLL can be achieved within a short time period. Moreover, a voltage variation is restricted to a small variation as compared with a conventional loop filter. Thus, it is preferable that the present invention is applied to a dual loop PLL.

The invention claimed is:

1. A dual loop PLL comprising:
a frequency comparison loop which includes a frequency comparator and a phase comparison loop which includes a phase comparator,
wherein in the frequency comparison loop, a frequency comparison between a reference frequency and an output frequency is performed based on a dichotomizing search method, and
wherein the frequency comparison loop includes:
the frequency comparator,
an up/down counter for incrementing or decrementing a count value according to a comparison result from the frequency comparator, and
a voltage controlled oscillator for changing the output frequency according to the count value of the up/down counter; and
the up/down counter includes:
a register for storing the count value,
an input control circuit for outputting a positive or negative value of a ½ of a previous addition/subtraction result value according to the comparison result from the frequency comparator, and
an adder for adding the count value of the register to the output of the input control circuit.

2. A dual loop PLL according to claim 1, wherein the frequency comparator includes an accuracy varying circuit for varying a frequency comparison accuracy for respective steps of the frequency comparison along with the progress of the dichotomizing search.

3. A dual loop PLL according to claim 1, wherein:
the frequency comparator is structured such that:
if the output frequency is equal to or lower than the reference frequency, the frequency comparator outputs an UP signal, and
if the output frequency is equal to or higher than the reference frequency, the frequency comparator outputs an DOWN signal; and
the up/down counter includes an error count prevention circuit for prohibiting an increment or decrement of the count value when the UP signal and DOWN signal are simultaneously received from the frequency comparator.

4. A dual loop PLL according to claim 1, wherein the frequency comparator avoids comparing a transient frequency, which occurs during the period when the voltage controlled oscillator controls a variation in the output frequency, with the reference frequency.

5. A dual loop PLL comprising:
a frequency comparison loop which includes a frequency comparator and a phase comparison loop which includes a phase comparator,
wherein in the frequency comparison loop, a frequency comparison between a reference frequency and an output frequency is performed based on a dichotomizing search method, and
wherein the phase comparison loop includes:
a voltage controlled oscillator, and
a loop filter placed at a stage previous to the voltage controlled oscillator; and
when the frequency comparison loop is formed,
the loop filter is disconnected from the voltage controlled oscillator, and
a reference voltage having a predetermined value is supplied to the loop filter and the voltage controlled oscillator.

6. A dual loop PLL according to claim 1, wherein:
when the frequency comparison loop is formed, the voltage controlled oscillator receives a reference voltage having a predetermined value; and
the up/down counter includes a priority switch circuit which receives a comparison result from the frequency comparator and, if the reference frequency and the output frequency are equal to each other, priorly increments or decrements a count value according to a variation of the reference voltage from the predetermined value.

7. A dual loop PLL comprising:
a frequency comparison loop which includes a frequency comparator and a phase comparison loop which includes a phase comparator,
a charge pump placed at a stage subsequent to the phase comparator;
a loop filter which is charged and discharged by the charge pump; and
a voltage controlled oscillator to which an input voltage is supplied from the loop filter,
wherein in the frequency comparison loop, a frequency comparison between a reference frequency and an output frequency is performed based on a dichotomizing search method, and
wherein in the frequency comparison mode, the charge pump supplies a reference voltage having a predetermined value to the loop filter, and in the phase comparison mode, the charge pump charges or discharges the loop filter according to an output of the phase comparator.

8. A dual loop PLL comprising:
a frequency comparison loop which includes a frequency comparator and a phase comparison loop which includes a phase comparator, wherein in the frequency comparison loop, a frequency comparison between a reference frequency and an output frequency is performed based on a dichotomizing search method, and wherein the phase comparison loop includes:
   a charge pump placed at a stage subsequent to the phase comparator,
   a loop filter placed at a stage subsequent to the charge pump; and the loop filter includes:
   a resistor having an end connected to the output side of the charge pump, and
   a N-type transistor and a P-type transistor whose gate terminals are connected to the other end of the resistor, wherein the N-type transistor has a source terminal, a drain terminal and a bulk terminal which are connected to ground, and the P-type transistor has a source terminal, a drain terminal and a bulk terminal which are connected to a power supply.

9. A dual loop PLL, comprising: a frequency comparison loop which includes a frequency comparator and a phase comparison loop which includes a phase comparator, wherein in the frequency comparison loop, a frequency comparison between a reference frequency and an output frequency is performed based on a dichotomizing search method, and the frequency comparator in the frequency comparison loop includes an accuracy varying circuit for varying a frequency comparison accuracy for respective steps of the frequency comparison along with the progress of the dichotomizing search.

* * * * *